(12) United States Patent
Akasawa et al.

(10) Patent No.: US 11,996,133 B2
(45) Date of Patent: May 28, 2024

(54) MEMORY CIRCUIT USING OXIDE SEMICONDUCTOR

(71) Applicant: SEMICONDUCTOR ENERGY LABORATORY CO., LTD., Atsugi (JP)

(72) Inventors: Fumika Akasawa, Kanagawa (JP); Munehiro Kozuma, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 143 days.

(21) Appl. No.: 17/618,993

(22) PCT Filed: Jun. 9, 2020

(86) PCT No.: PCT/IB2020/055394
§ 371 (c)(1),
(2) Date: Dec. 14, 2021

(87) PCT Pub. No.: WO2020/254914
PCT Pub. Date: Dec. 24, 2020

(65) Prior Publication Data
US 2022/0366958 A1    Nov. 17, 2022

(30) Foreign Application Priority Data
Jun. 21, 2019    (JP) .................. 2019-115553

(51) Int. Cl.
*G11C 11/40* (2006.01)
*G11C 11/405* (2006.01)
(Continued)

(52) U.S. Cl.
CPC ........ *G11C 11/405* (2013.01); *H01L 27/1207* (2013.01); *H01L 27/1225* (2013.01);
(Continued)

(58) Field of Classification Search
None
See application file for complete search history.

(56) References Cited

U.S. PATENT DOCUMENTS 5,841,690 A * 11/1998 Shibutani .............. G11C 11/405
365/150
6,314,017 B1    11/2001 Emori et al.
(Continued)

FOREIGN PATENT DOCUMENTS

JP    2007-096055 A    4/2007
JP    2007-123861 A    5/2007
(Continued)

OTHER PUBLICATIONS

International Search Report (Application No. PCT/IB2020/055394) dated Sep. 1, 2020 (5 pages).
(Continued)

*Primary Examiner* — Tan T. Nguyen
(74) *Attorney, Agent, or Firm* — NIXON PEABODY LLP; Jeffrey L. Costellia

(57) ABSTRACT

Since power source voltages are different depending on circuits used for devices, a circuit for outputting at least two or more power sources is additionally prepared. An object is to unify outputs of the power source voltages. A transistor using an oxide semiconductor is provided in such a manner that electrical charge is retained in a node where the transistor and a capacitor are electrically connected to each other, a reset signal is applied to a gate of the transistor to switch the states of the transistor from off to on, and the node is reset when the transistor is on. A circuit configuration that generates and utilizes a potential higher than or equal to a potential of a single power source can be achieved.

9 Claims, 13 Drawing Sheets

(51) Int. Cl.
*H01L 27/12* (2006.01)
*H01L 29/786* (2006.01)
*H10B 12/00* (2023.01)

(52) U.S. Cl.
CPC .... *H01L 27/1255* (2013.01); *H01L 29/78648* (2013.01); *H01L 29/7869* (2013.01); *H10B 12/00* (2023.02)

(56) References Cited

U.S. PATENT DOCUMENTS

| | | | |
|---|---|---|---|
| 7,674,650 B2 | 3/2010 | Akimoto et al. | |
| 8,446,188 B2 | 5/2013 | Bellur et al. | |
| 8,614,916 B2 | 12/2013 | Nagatsuka et al. | |
| 8,860,108 B2 | 10/2014 | Yamazaki et al. | |
| 9,041,449 B2 * | 5/2015 | Yoneda | H01L 27/1225 327/210 |
| 9,263,451 B2 | 2/2016 | Matsubayashi et al. | |
| 9,349,418 B2 | 5/2016 | Yamamoto et al. | |
| 9,424,890 B2 | 8/2016 | Inoue et al. | |
| 9,496,285 B2 | 11/2016 | Nagatsuka | |
| 9,520,873 B2 | 12/2016 | Kurokawa et al. | |
| 9,672,873 B2 | 6/2017 | Yamamoto et al. | |
| 9,755,643 B2 | 9/2017 | Inoue et al. | |
| 2005/0237786 A1 | 10/2005 | Atwood et al. | |
| 2012/0033488 A1 | 2/2012 | Nagatsuka et al. | |
| 2012/0104480 A1 | 5/2012 | Matsubayashi et al. | |
| 2014/0241054 A1 | 8/2014 | Koyama | |
| 2015/0048362 A1 * | 2/2015 | Endo | H01L 27/1225 257/43 |
| 2015/0187775 A1 | 7/2015 | Yamamoto et al. | |
| 2015/0270270 A1 | 9/2015 | Kato | |
| 2016/0172383 A1 | 6/2016 | Nagatsuka | |
| 2021/0210517 A1 | 7/2021 | Kawashima et al. | |
| 2021/0318856 A1 | 10/2021 | Ikeda et al. | |
| 2022/0102560 A1 * | 3/2022 | Tanaka | H01L 27/1225 |

FOREIGN PATENT DOCUMENTS

| | | |
|---|---|---|
| JP | 2011-119674 A | 6/2011 |
| JP | 2012-256824 A | 12/2012 |
| JP | 2015-187902 A | 10/2015 |
| JP | 2016-115932 A | 6/2016 |
| KR | 2013-0142109 A | 12/2013 |
| WO | WO-2012/057296 | 5/2012 |

OTHER PUBLICATIONS

Written Opinion (Application No. PCT/IB2020/055394) dated Sep. 1, 2020 (8 pages).

* cited by examiner

FIG. 11A
Intermediate state
New crystalline phase
| Amorphous | Crystalline | Crystal |
|---|---|---|
| •completely amorphous | •CAAC<br>•nc<br>•CAC | •single crystal<br>•poly crystal |
FIG. 11B
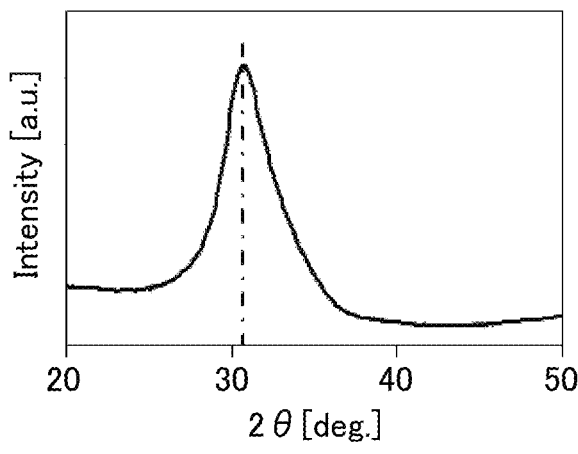
FIG. 11C
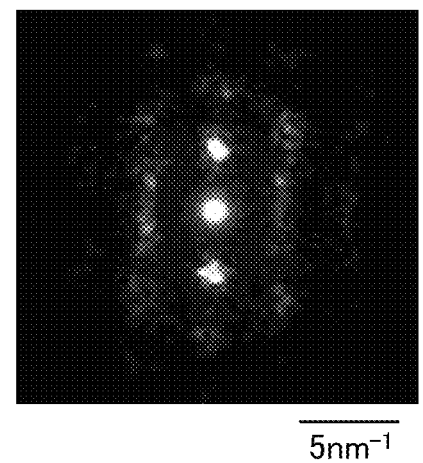

MEMORY CIRCUIT USING OXIDE SEMICONDUCTOR

TECHNICAL FIELD

The present invention relates to a semiconductor device using an oxide semiconductor and a manufacturing method thereof. One embodiment of the present invention relates to a process, a machine, manufacture, or a composition of matter. Accordingly, more specific examples of the technical field of one embodiment of the present invention disclosed in this specification include a semiconductor device, a display device, a liquid crystal display device, a light-emitting device, a lighting device, a power storage device, a memory device, an imaging device, an operation method thereof, and a manufacturing method thereof.

Note that in this specification, a semiconductor device refers to any device that can function by utilizing semiconductor characteristics, and an electro-optical device, a semiconductor circuit, and an electronic device are all semiconductor devices.

BACKGROUND ART

A technique for forming a transistor using a metal oxide formed over a substrate has been attracting attention. For example, a technique in which a transistor formed using zinc oxide or In—Ga—Zn-based oxide is used as a switching element or the like of a pixel of a display apparatus is disclosed in Patent Document 1 and Patent Document 2.

Patent Document 3 discloses a memory device having a configuration in which a transistor with an extremely low off-state current is used in a memory cell.

REFERENCE

Patent Document

[Patent Document 1] Japanese Published Patent Application No. 2007-123861
[Patent Document 2] Japanese Published Patent Application No. 2007-96055
[Patent Document 3] Japanese Published Patent Application No. 2011-119674

SUMMARY OF THE INVENTION

Problems to be Solved by the Invention

Since power source voltages are different between circuits, in order to output two or more power sources, circuits for outputting different voltages need to be prepared. In view of this, an object is to unify outputs of the power source voltages. In the case where this problem can be solved, the circuit configuration is simplified and the number of terminals is reduced, leading to a reduction in the manufacturing cost.

Another object is a simplification of circuits. Another object is to achieve a reduction in the number of elements or in the layout area.

Another object is to provide a memory control method in which data is written to memory cells with use of a memory controller that controls a plurality of memory cells.

Another object is to provide a memory system including a memory cell and a memory controller which prevent circuit complication, an increase in a circuit area, and an increase in power consumption.

Means for Solving the Problems

Provided is a circuit configuration which does not use a level shifter or a voltage generation circuit (a boosting circuit) and does not bring circuit complication, and which includes an additional circuit element for generating capacitive coupling, and generates and utilizes a potential higher than or equal to a potential of a single power source.

A transistor using an oxide semiconductor is provided in such a manner that electrical charge is retained in a node where the transistor and a capacitor are electrically connected to each other, a reset signal is applied to a gate of the transistor to switch the states of the transistor from off to on, and the node is reset when the transistor is on.

Specifically, a first transistor using an oxide semiconductor, a second transistor, a third transistor, a first capacitor, and a second capacitor are used to form a circuit.

A circuit configuration disclosed in this specification is a memory circuit including a first transistor and a second transistor which are electrically connected to a data line; a memory controller electrically connected to a gate of the first transistor and a gate of the second transistor; a third transistor whose off state is switched to an on state by a reset signal applied to a gate wherein a first node is reset in the on state; and a first capacitor and a second capacitor connected in series. One of a source and a drain of the second transistor is electrically connected to the data line. One of a source and a drain of the third transistor is electrically connected to one electrode of the first capacitor, and the other electrode of the first capacitor is electrically connected to one of a source and a drain of the first transistor. The one electrode of the first capacitor is electrically connected to the one of the source and the drain of the second transistor. The other electrode of the first capacitor is electrically connected to one electrode of the second capacitor, and a second node is formed between the first capacitor and the second capacitor. The first node and the second node retain different potentials.

In the above configuration, the first capacitor has a higher capacitance value than the second capacitor. One of the features is that voltage can be adjusted by the second capacitor.

In a circuit configuration of the present invention, the number of capacitors can be one. In such a case, a memory circuit includes a first transistor, a second transistor, a third transistor, and a capacitor. One of a source and a drain of the first transistor is electrically connected to one of a source and a drain of the second transistor. The other of the source and the drain of the second transistor is electrically connected to one of a source and a drain of the third transistor. The one of the source and the drain of the third transistor is electrically connected to one electrode of the capacitor, and the other electrode of the capacitor is electrically connected to the other of the source and the drain of the first transistor. The one electrode of the capacitor is electrically connected to the other of the source and the drain of the second transistor. A reset line is electrically connected to a gate of the second transistor. A data line is electrically connected to the one of the source and the drain of the second transistor and electrically connected to the one of the source and the drain of the third transistor. A connection point between the other electrode of the capacitor and the other of the source and the drain of the first transistor is a node.

As each of the above transistors, a transistor using a metal oxide in a channel formation region (hereinafter, an OS transistor) is preferably used.

Specifically, an OS transistor is preferably used as any of or all of the first transistor, the second transistor, and the third transistor.

In this specification and the like, the memory controller has a function of controlling one or more memory cell array units.

Note that in this specification and the like, a node (also referred to as a potential retention node) is an element (e.g., a wiring) that enables electrical connection between elements included in a circuit. Therefore, a "node to which A is connected" is a wiring that is electrically connected to A and can be regarded as having the same potential as A. Note that even when one or more elements (e.g., switches, transistors, capacitors, inductors, resistors, or diodes) which enable electrical connection are inserted between A and the node which are connected through a wiring, the wiring can be regarded as the "node to which A is connected" as long as the wiring has the same potential as A.

Effect of the Invention

Different potentials can be applied to a gate of a transistor in a circuit and a gate of a transistor in another circuit without using a level shifter or a voltage generation circuit (a boosting circuit). This circuit configuration can prevent an increase in the circuit area and can reduce power consumption.

BRIEF DESCRIPTION OF THE DRAWINGS

FIG. 11A is a diagram showing the classification of crystal structures of IGZO. FIG. 11B is a diagram showing an XRD spectrum of a CAAC-IGZO film. FIG. 11C is an image showing a nanobeam electron diffraction pattern of a CAAC-IGZO film.

MODE FOR CARRYING OUT THE INVENTION

Embodiments of the present invention are described in detail below with reference to the drawings. Note that the present invention is not limited to the following description, and it is readily understood by those skilled in the art that modes and details of the present invention can be modified in various ways. In addition, the present invention should not be construed as being limited to the description of the following embodiments.

Embodiment 1

In this embodiment, a memory circuit of one embodiment of the present invention will be described with reference to drawings.

Figure 1:
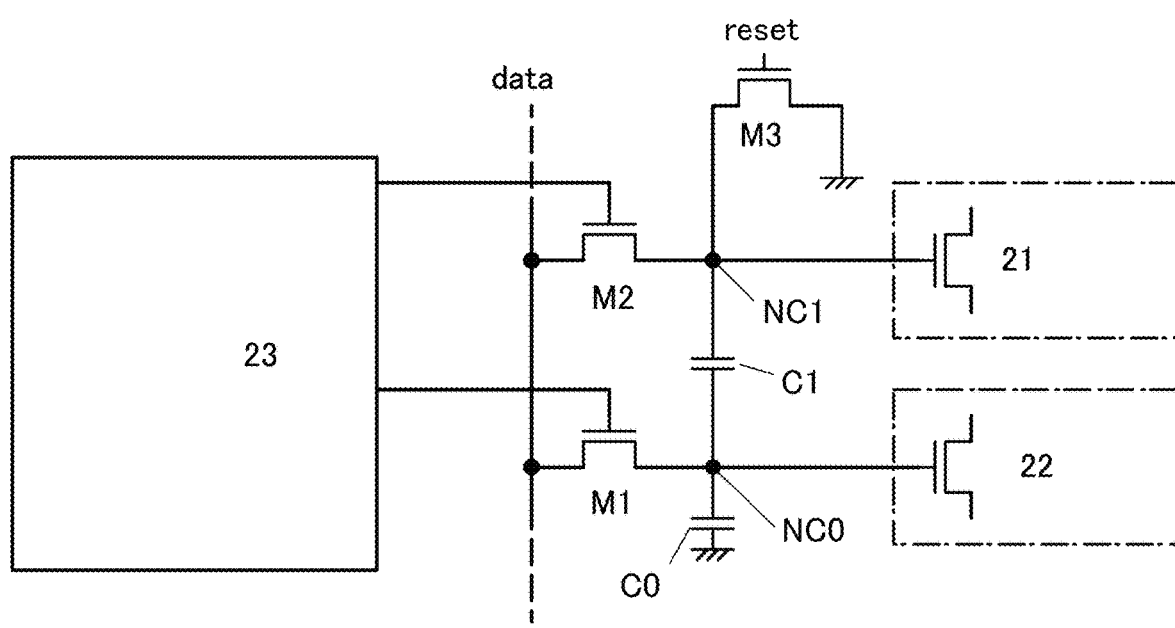
FIG. 1 is an example of a circuit diagram showing one embodiment of the present invention.

FIG. 1 shows a circuit configuration in which different potentials can be written to a first circuit 21 and a second circuit 22. The circuit configuration shown in FIG. 1 includes at least transistors M1, M2, and M3 and two capacitors C0 and C1. Specifically, a potential higher than or equal to a potential supplied from a single power source can be written to the second circuit 22 by capacitive coupling. Note that a detailed driving method will be specifically described in Embodiment 2. The configuration in FIG. 1 allows a potential retention node NC0 and a potential retention node NC1 to retain different potentials, and thus a potential can be supplied to the first circuit 21 without providing an additional level shifter or voltage generation circuit (boosting circuit).

Figure 2:
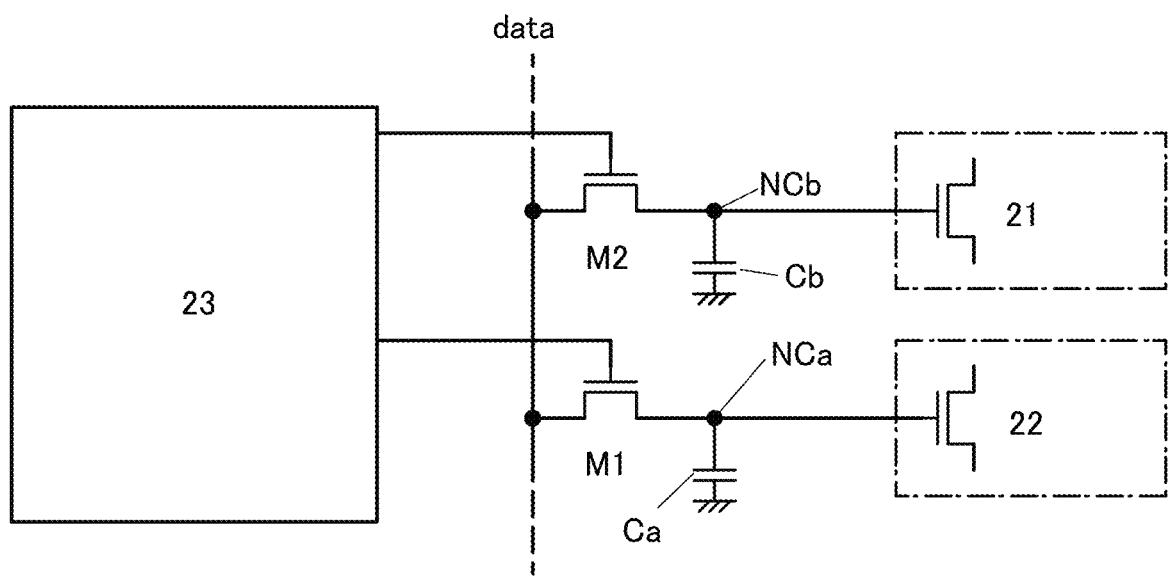
FIG. 2 is a circuit diagram showing a comparative example.

FIG. 2 shows a comparative example. In a circuit configuration shown in FIG. 2, an OS transistor, which causes a low off-state leakage current, is used as the M1 and thus an analog potential can be retained in a potential retention node NCa for a long period.

In FIG. 2, in the case where a circuit is assumed to be driven by a single power source, a gate writing maximum potential of the M1 is Vc, and only a potential (Vc−Vth) that is lower by threshold can be written to the potential retention node NCa. Therefore, a potential higher than or equal to (Vc−Vth) cannot be written in the circuit configuration shown in FIG. 2. In order to write a potential higher than or equal to (Vc−Vth), a level shifter or a voltage generation circuit (a boosting circuit) needs to be added to the circuit configuration shown in FIG. 2. In such a case, demerits, such as an increase in circuit area or an increase in power consumption, might occur.

In the circuit configuration shown in FIG. 2, when an OS transistor, which causes a low off-state leakage current, is used as the M2 as well as the M1, an analog potential can be retained in a potential retention node NCb for a long period. As in the potential retention node NCa, a potential higher than or equal to a potential supplied from a single power source cannot be written to the potential retention node NCb.

As described above, the circuit configuration in FIG. 1 in which only the transistor M3 is added to FIG. 2 can provide an equivalent or better effect than the configuration in which an additional level shifter or voltage generation circuit (boosting circuit) is provided to FIG. 2.

Embodiment 2

In this embodiment, a memory circuit of one embodiment of the present invention and a driving method thereof will be described with reference to drawings.

Figure 3A:
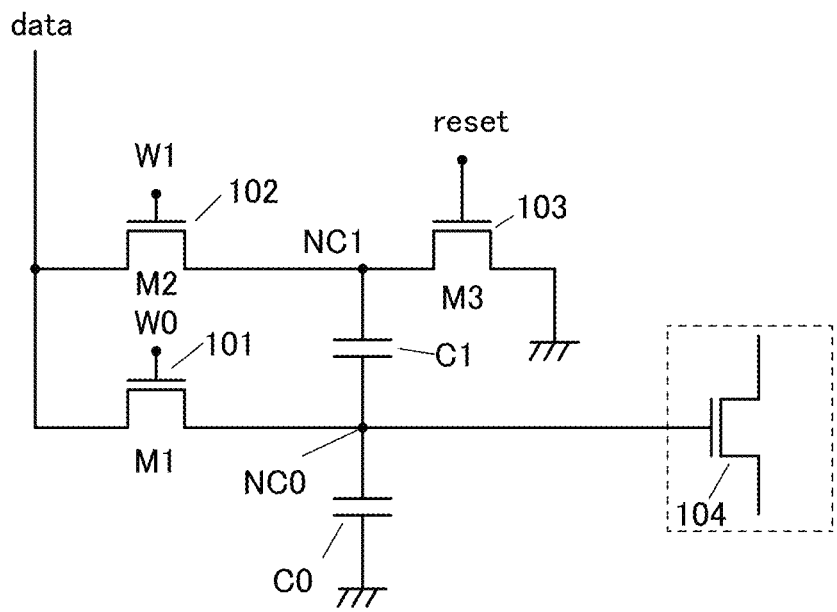
FIG. 3A is a circuit diagram showing one embodiment of the present invention and FIG. 3B is a timing chart.

FIG. 3A shows an example of a memory circuit of one embodiment of the present invention, and is a superordinate conceptual view obtained by eliminating the memory controller 23 and the first circuit 21 from the circuit shown in FIG. 1 in Embodiment 1. FIG. 3A shows a memory circuit which includes a first transistor 101, a second transistor 102, a third transistor 103, a capacitor C1, and a capacitor C0. Note that a fourth transistor 104 indicates a transistor in another circuit, and retains a potential of the potential retention node NC0 to which a gate of the fourth transistor 104 is connected.

Figure 3B:
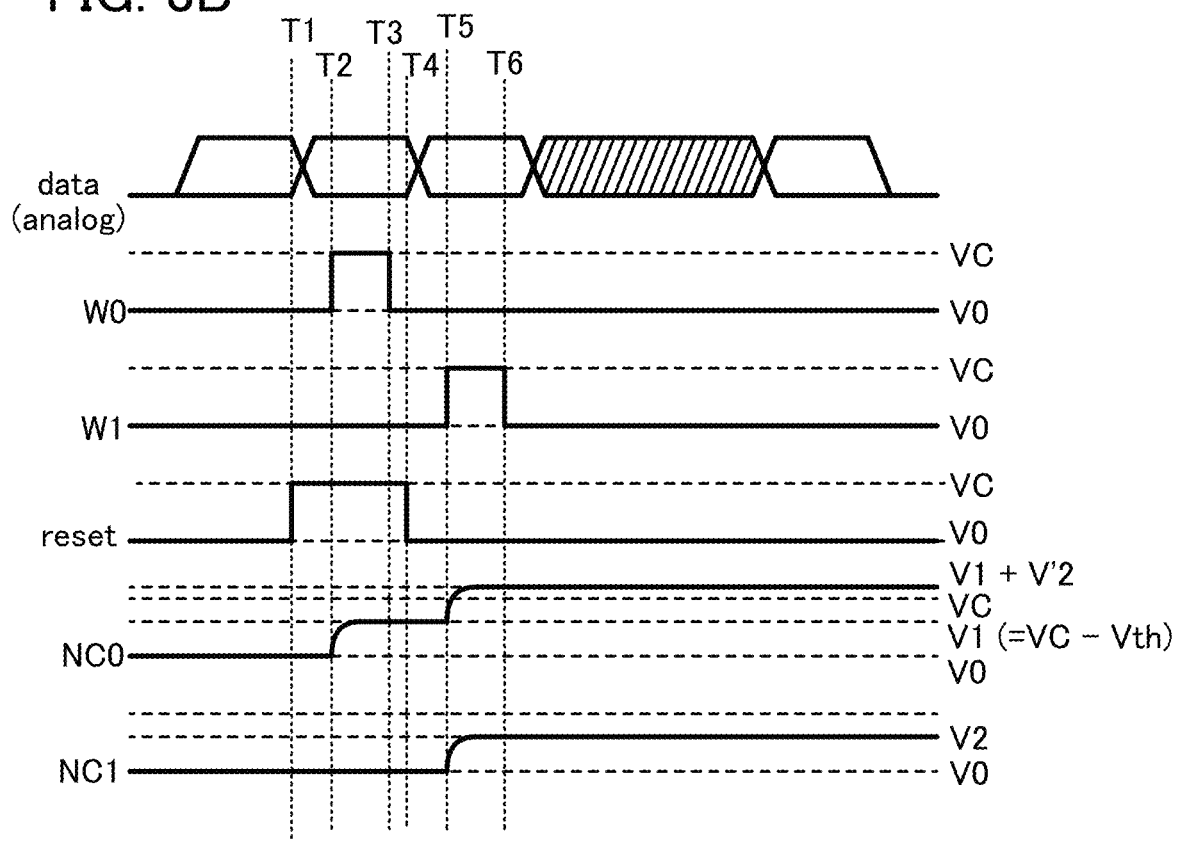

An example of operation of writing a potential higher than or equal to Vc to the potential retention node NC0 in FIG. 3A is described with reference to a timing chart shown in FIG. 3B.

First, operation of writing data "V1" to the potential retention node NC0 is described. Note that in potential distribution, potential coupling, or potential loss, detailed changes caused by a circuit configuration, an operation timing, and the like are not considered here.

At Time T1, a potential of a wiring reset is set to "H" to turn on the transistor M3 (the third transistor 103), whereby the potential retention node NC1 becomes "V0".

At Time T2, a potential of a wiring W0 is set to "H" to turn on the transistor M1 (the first transistor 101) so that "Vc−Vth" is supplied to the potential retention node NC0. Vc−Vth is equal to V1. In the case where an analog potential higher than or equal to V1 and lower than or equal to Vc is supplied through a data line, the gate writing maximum potential of the transistor M1 is Vc, and thus Vc−Vth, which is lower by threshold, is written to the NC0.

At Time T3, the potential of the wiring W0 is set to "L" to turn off the transistor M1. At Time T4, the potential of the wiring reset is set to "L". During a period from Time T3 to Time T4, "V1=Vc−Vth" is retained in the potential retention node NC0.

At Time T5, the potential of the wiring W1 is set to "H" to turn on the transistor M2 (the second transistor 102). Through the data line, "V2" is supplied to the potential retention node NC1. Due to capacitive coupling, the potential of the potential retention node NC0 becomes higher than V1 by V'2=e1/(e1+e0)×V2 to reach V1+V'2. (Here, electrostatic capacitance of C1 is denoted by e1 and electrostatic capacitance of C0 is denoted by e0.) By adjusting the electrostatic capacitance ratio between the capacitor C1 and the capacitor C0, the writable potential range can be controlled. Note that V1+V'2 is higher than Vc as shown in FIG. 3B.

At Time T6, a W1 signal is set to Low, so that the transistor M2 is turned off. At this time, V1+V'2 is retained in the potential retention node NC0. In addition, V2 is retained in the potential retention node NC1.

In the above manner, a circuit configuration capable of writing a potential higher than or equal to Vc to the potential retention node NC0 can be achieved.

Figure 4:
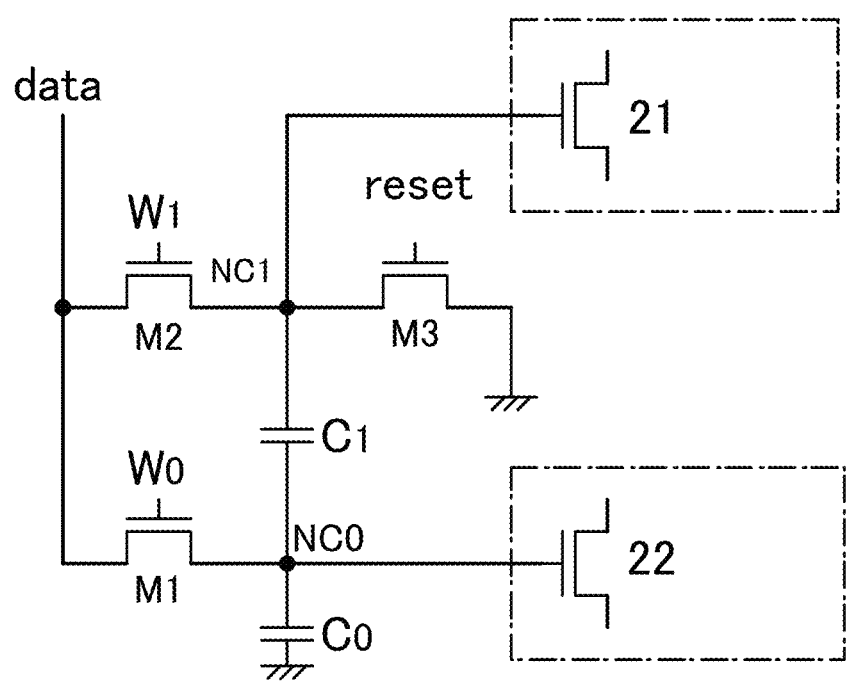
FIG. 4 is an example of a circuit diagram showing one embodiment of the present invention.

FIG. 4 is a modification example of FIG. 3A, which shows a case where a circuit whose gate is connected to the potential retention node NC1 is further provided, and which can be said to have a configuration similar to FIG. 1. When each of W1 and W0 is connected to the memory controller 23, the configuration shown in FIG. 1 can be obtained.

Embodiment 3

In this embodiment, as an application example of a circuit including the memory circuit of one embodiment of the present invention, an example in which the circuit is applied to a protection circuit of a secondary battery is described with reference to drawings.

Figure 5:
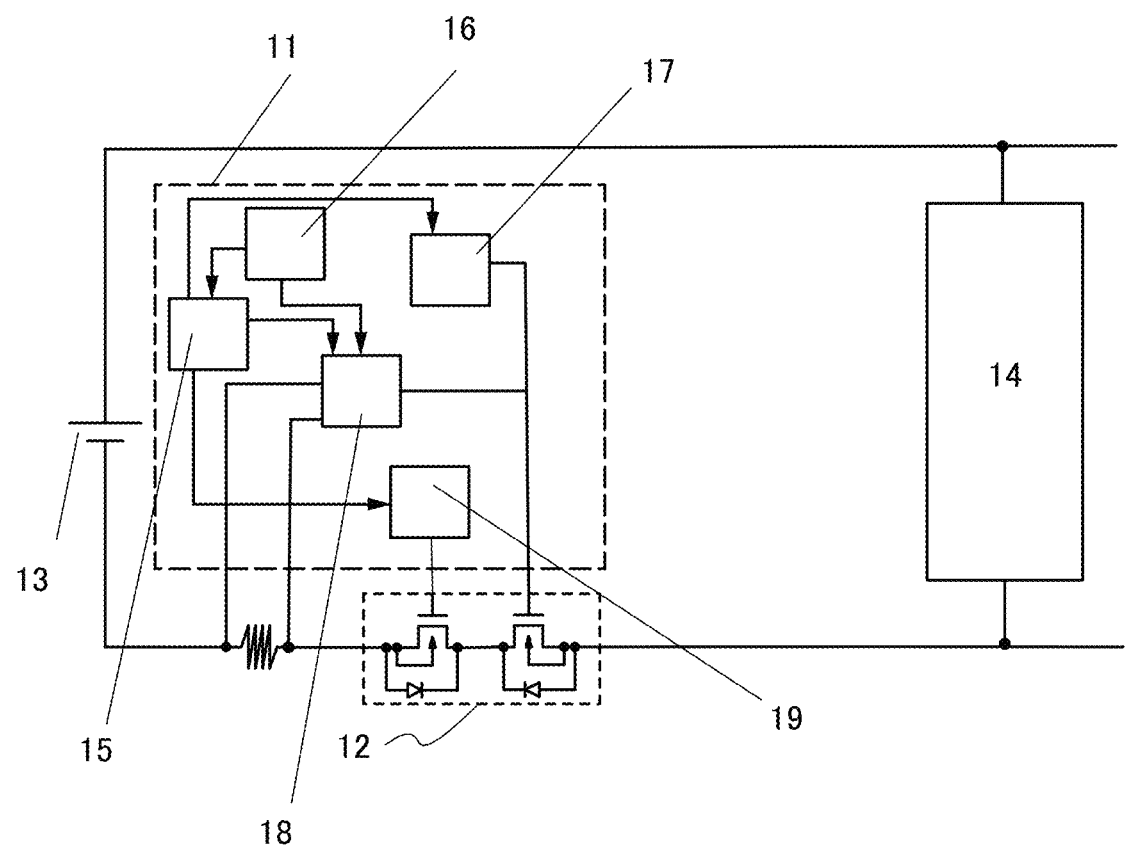
FIG. 5 is a block diagram showing one embodiment of the present invention.

FIG. 5 is an example of a block diagram showing an example of a management system for a secondary battery.

In FIG. 5, a disconnecting switch 12 composed of two transistors is provided between a secondary battery 13 and a charge control circuit 14 electrically connected to the secondary battery 13. As the disconnecting switch 12, a power transistor (also referred to as a power MOS) may be used; alternatively, an N-channel MOSFET or a P-channel MOSFET may be used; further alternatively, SiC, GaN, or gallium oxide can be used as another material.

A battery protection circuit 11 includes at least a memory circuit 15, a control circuit 16, a comparison circuit 18, the disconnecting switch 12, a charge overcurrent detection circuit 17, and an overdischarge current detection circuit 19. In FIG. 5, a group of circuits surrounded by a dotted line corresponds to an IC chip.

As the memory circuit 15, the memory circuit shown in FIG. 3A or FIG. 4 is used. Each of the fourth transistor 104 shown in FIG. 3A and the first circuit 21 and the second circuit 22 shown in FIG. 4 corresponds to the charge overcurrent detection circuit 17 or the overdischarge current detection circuit 19. With use of the memory circuit 15, a potential higher than or equal to a potential supplied from a single power source (here, output voltage of the secondary battery 13) can be written to the charge overcurrent detection circuit 17 and the overdischarge current detection circuit 19.

In the case where the memory circuit 15 is not used, a level shifter or a voltage generation circuit (a boosting circuit) is additionally provided, which might increase the circuit area. Furthermore, the charge control circuit 14 includes a level shifter or a voltage generation circuit (a boosting circuit) and a terminal that inputs a signal of the level shifter or the voltage generation circuit to the battery protection circuit 11 is additionally provided over an IC chip (the battery protection circuit 11); accordingly, when different voltages are needed for circuits, the number of terminals is increased.

The configuration shown in FIG. 5 can prevent an increase in area occupied by circuits, an increase in the number of terminals, or the like.

In the battery protection circuit 11, comparison with a preceding voltage by the comparison circuit 18 can detect a micro-short circuit that causes a large difference, and charging is stopped by turning off the disconnecting switch 12 by the first control circuit 16.

An instant voltage change can be detected by the battery protection circuit 11. The battery protection circuit 11 can also be referred to as a simple protection circuit that immediately stops charging when detecting an abnormality, even though the cause for a sudden charging voltage change is unknown.

This embodiment shows, but is not particularly limited to, an example in which the battery protection circuit 11 is one IC chip and the charge control circuit 14 is another IC chip, and the battery protection circuit 11 and the charge control circuit 14 may be one IC chip. In that case, the memory circuit 15 is used for a circuit in the charge control circuit 14 which needs a voltage higher than an output voltage of the secondary battery 13, whereby a potential higher than or equal to a potential supplied from a single power source can be written. Consequently, the area occupied by circuits can be significantly reduced.

Embodiment 4

In this embodiment, structures of transistors that can be used in the semiconductor device described in the above embodiments are described. As an example, a structure in which transistors having different electrical characteristics are stacked is described. With the structure, the degree of freedom in design of the semiconductor device can be increased. Stacking transistors having different electrical characteristics can increase the degree of integration of the semiconductor device.

Figure 6:
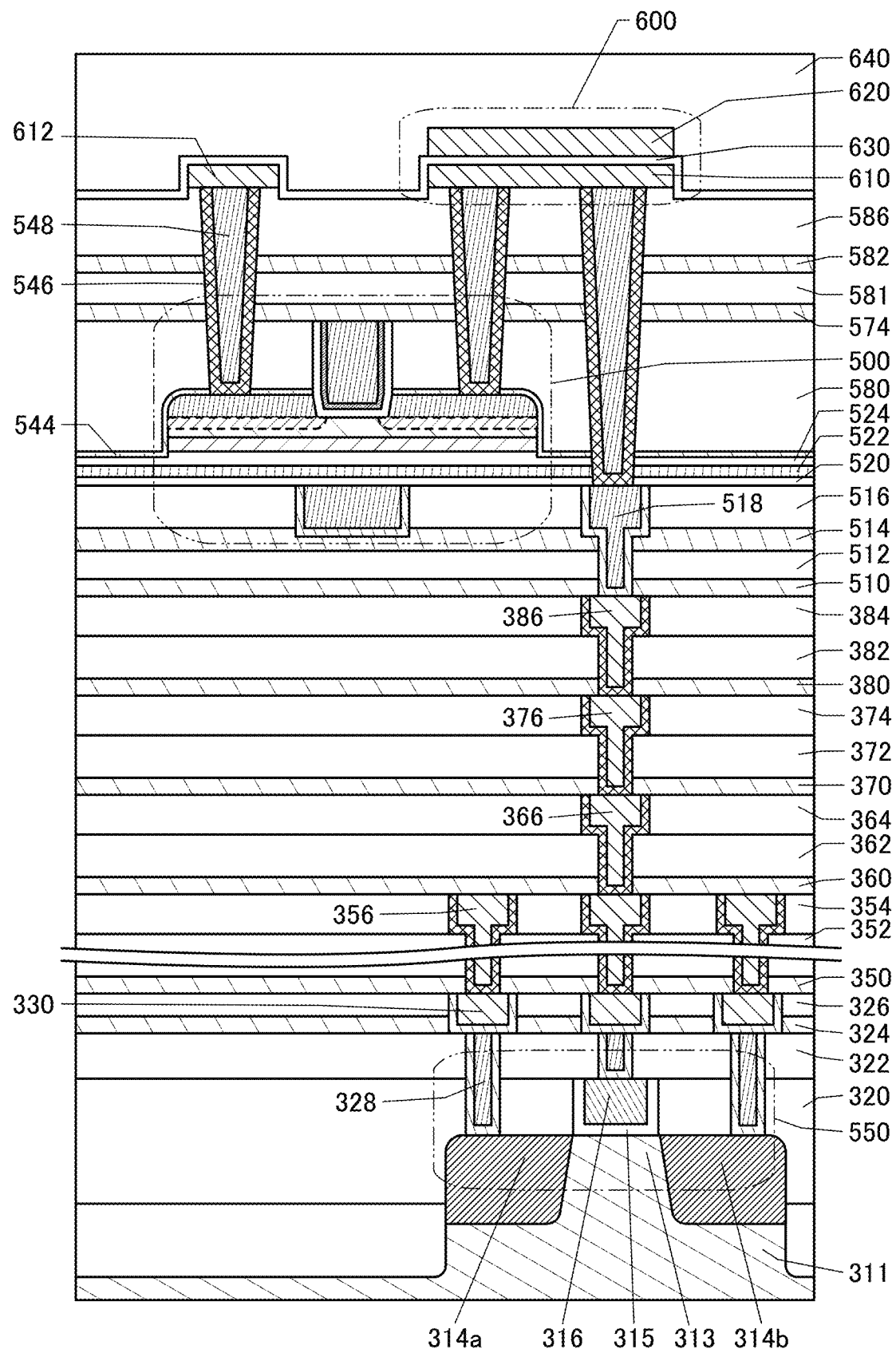
FIG. 6 is a diagram showing a structure example of a semiconductor device.
Figure 8A:
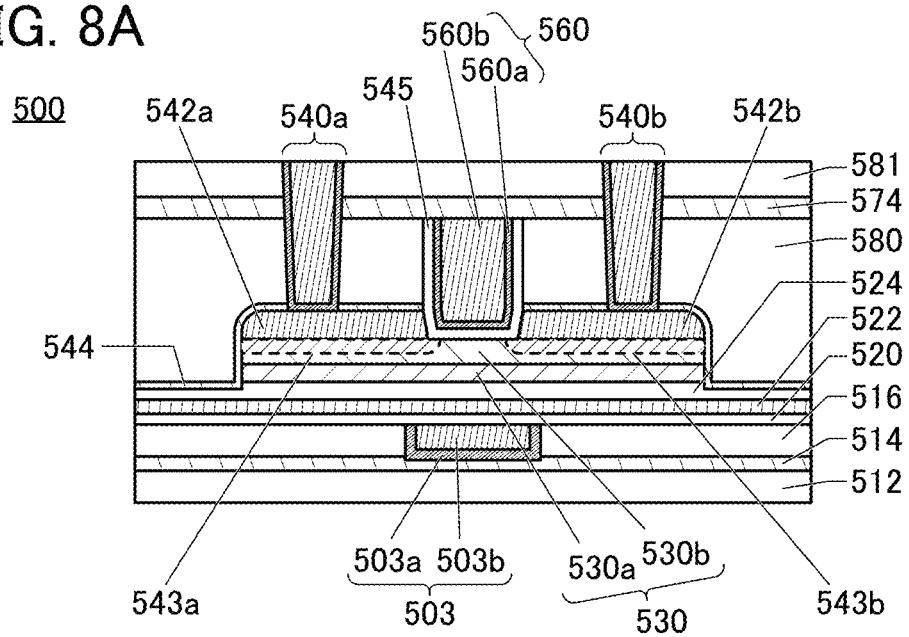
FIG. 8A, FIG. 8B, and FIG. 8C are diagrams showing structure examples of a transistor.
Figure 8B:
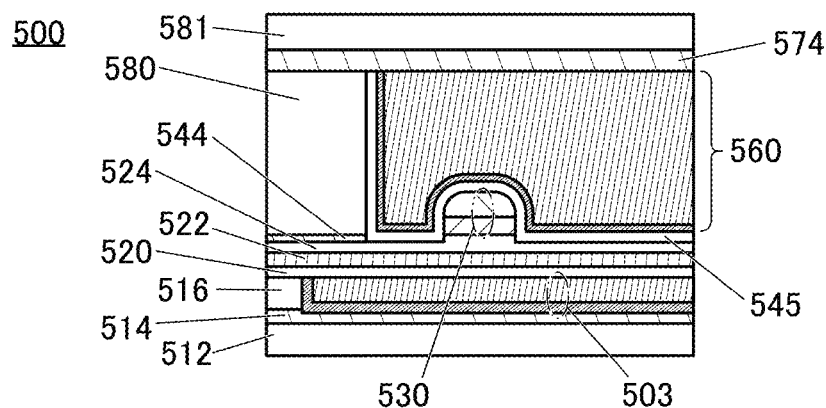
Figure 8C:
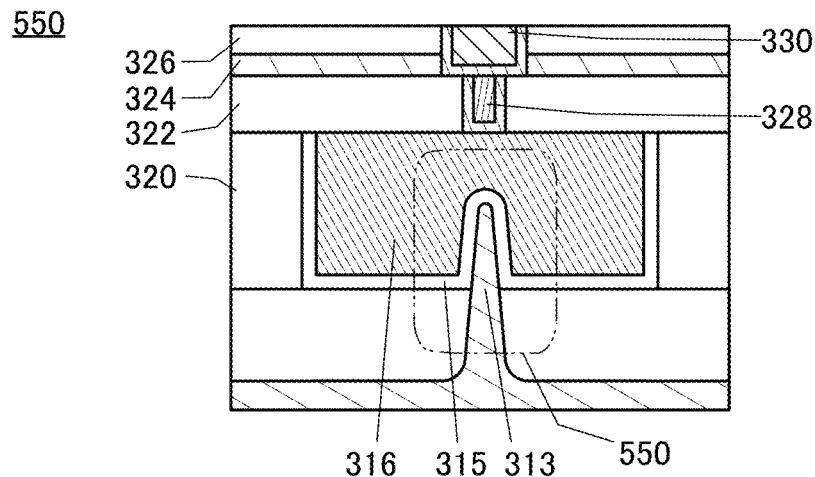

FIG. 6 illustrates part of a cross-sectional structure of a semiconductor device. A semiconductor device illustrated in FIG. 6 includes a transistor 550, a transistor 500, and a capacitor 600. FIG. 8A is a cross-sectional view of the transistor 500 in the channel length direction, FIG. 8B is a cross-sectional view of the transistor 500 in the channel width direction, and FIG. 8C is a cross-sectional view of the transistor 550 in the channel width direction. For example, the transistor 500 corresponds to the fourth transistor 104 described in the above embodiments and the transistor 550 corresponds to any one of the first transistor 101, the second transistor 102, and the third transistor 103. The capacitor 600 corresponds to the capacitor C1.

The transistor 500 is an OS transistor. The transistor 500 has an extremely low off-state current. Accordingly, data voltage or charge written to a storage node through the transistor 500 can be retained for a long time. In other words, power consumption of the semiconductor device can be reduced because a storage node has a low frequency of refresh operation or requires no refresh operation.

In FIG. 6, the transistor 500 is provided above the transistor 550, and the capacitor 600 is provided above the transistor 550 and the transistor 500.

The transistor 550 is provided over a substrate 311 and includes a conductor 316, an insulator 315, a semiconductor region 313 that is part of the substrate 311, and a low-resistance region 314a and a low-resistance region 314b each functioning as a source region or a drain region.

As illustrated in FIG. 8C, in the transistor 550, a top surface and a side surface in the channel width direction of the semiconductor region 313 are covered with the conductor 316 with the insulator 315 therebetween. Such a Fin-type transistor 550 can have an increased effective channel width, and thus have improved on-state characteristics. In addition, since contribution of an electric field of a gate electrode can be increased, the off-state characteristics of the transistor 550 can be improved.

Note that the transistor 550 can be either a p-channel transistor or an n-channel transistor.

A region of the semiconductor region 313 where a channel is formed, a region in the vicinity thereof, the low-resistance region 314a and the low-resistance region 314b each functioning as a source region or a drain region, and the like preferably contain a semiconductor such as a silicon-based semiconductor, and preferably contain single crystal silicon. Alternatively, the regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and changing the lattice spacing is used. Alternatively, the transistor 550 may be a HEMT with the use of GaAs and GaAlAs, or the like.

The low-resistance region 314a and the low-resistance region 314b contain an element which imparts n-type conductivity, such as arsenic or phosphorus, or an element which imparts p-type conductivity, such as boron, in addition to the semiconductor material used for the semiconductor region 313.

For the conductor 316 functioning as a gate electrode, a semiconductor material such as silicon containing the element which imparts n-type conductivity, such as arsenic or phosphorus, or the element which imparts p-type conductivity, such as boron, or a conductive material such as a metal material, an alloy material, or a metal oxide material can be used.

Note that since the work function of a conductor depends on the material of the conductor, the threshold voltage of the transistor can be adjusted by selecting the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

The transistor 550 may be formed using an SOI (silicon on insulator) substrate, for example.

As the SOI substrate, the following substrate may be used: an SIMOX (Separation by Implanted Oxygen) substrate which is formed in such a manner that after an oxygen ion is implanted into a mirror-polished wafer, an oxide layer is formed at a certain depth from the surface and defects generated in a surface layer are eliminated by high-temperature annealing, or an SOI substrate formed by using a Smart-Cut method in which a semiconductor substrate is cleaved by utilizing growth of a minute void, which is formed by implantation of a hydrogen ion, by thermal treatment; an ELTRAN method (a registered trademark: Epitaxial Layer Transfer); or the like. A transistor formed using a single crystal substrate contains a single crystal semiconductor in a channel formation region.

Figure 7:
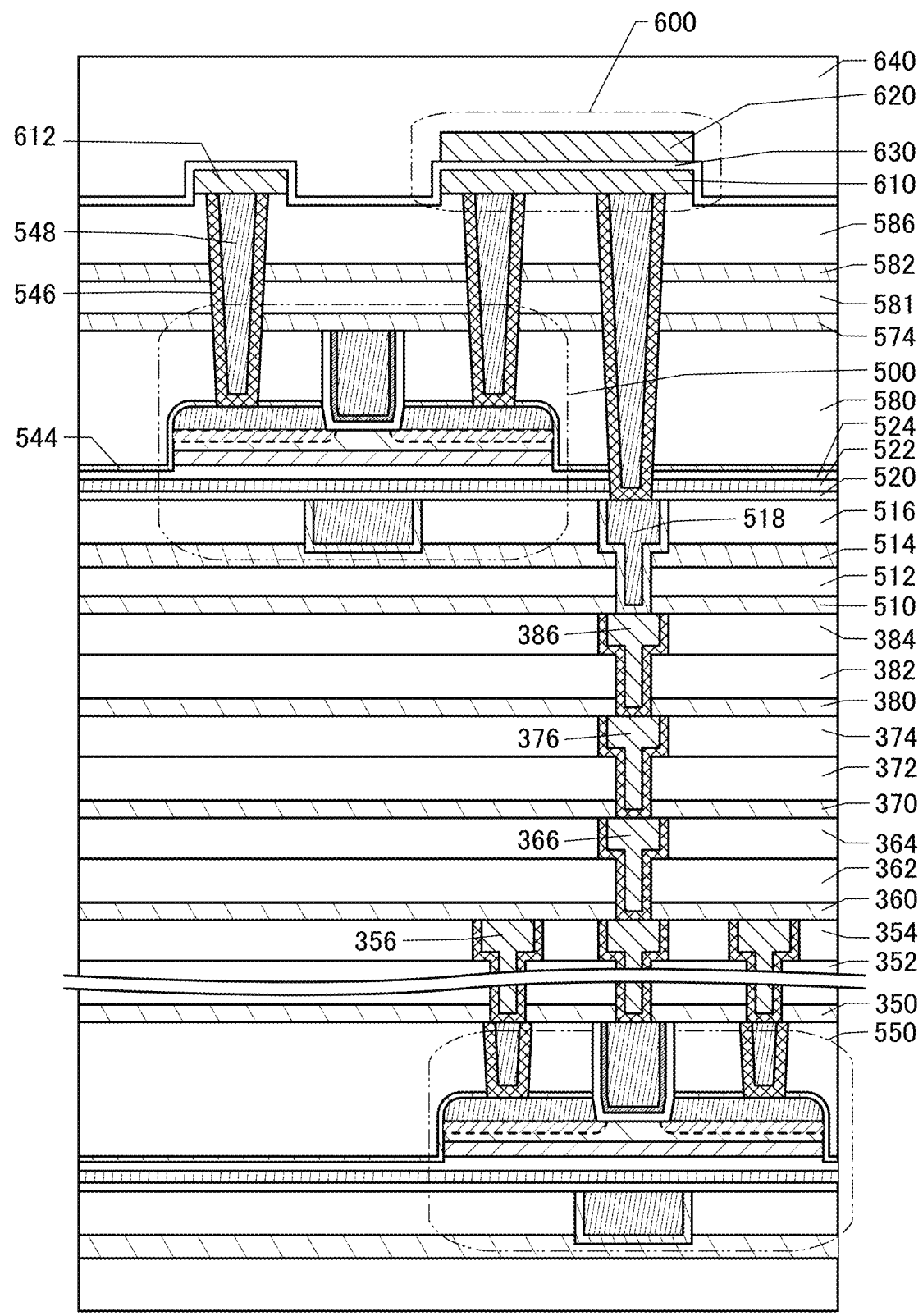
FIG. 7 is a diagram showing a structure example of a semiconductor device.

Note that the transistor 550 illustrated in FIG. 6 is an example and the structure is not limited thereto; an appropriate transistor can be used in accordance with a circuit configuration or a driving method. For example, when the semiconductor device is a single-polarity circuit using only OS transistors (which represent transistors having the same polarity, e.g., only n-channel transistors), the transistor 550 has a structure similar to that of the transistor 500 as illustrated in FIG. 7. Note that the details of the transistor 500 are described later.

An insulator 320, an insulator 322, an insulator 324, and an insulator 326 are stacked sequentially to cover the transistor 550.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, aluminum nitride, or the like can be used, for example.

Note that in this specification, silicon oxynitride refers to a material that contains oxygen at a higher proportion than nitrogen, and silicon nitride oxide refers to a material that contains nitrogen at a higher proportion than oxygen. Furthermore, in this specification, aluminum oxynitride refers to a material that contains oxygen at a higher proportion than nitrogen, and aluminum nitride oxide refers to a material that contains nitrogen at a higher proportion than oxygen.

The insulator 322 may have a function of a planarization film for eliminating a level difference caused by the transistor 550 or the like provided below the insulator 322. For example, a top surface of the insulator 322 may be planarized by planarization treatment using a chemical mechanical polishing (CMP) method or the like to increase planarity.

In addition, for the insulator 324, it is preferable to use a film having a barrier property that prevents diffusion of hydrogen or impurities from the substrate 311, the transistor 550, or the like into a region where the transistor 500 is provided.

For the film having a barrier property against hydrogen, silicon nitride formed using a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably provided between the transistor 500 and the transistor 550. The film that inhibits hydrogen diffusion is specifically a film from which a small amount of hydrogen is released.

The amount of released hydrogen can be analyzed by thermal desorption spectroscopy (TDS) or the like, for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the permittivity of the insulator 326 is preferably lower than that of the insulator 324. For example, the relative permittivity of the insulator 326 is preferably lower than 4, further preferably lower than 3. The relative permittivity of the insulator 326 is, for example, preferably 0.7 times or less, further preferably 0.6 times or less the relative permittivity of the insulator 324. When a material with a low permittivity is used for an interlayer film, parasitic capacitance generated between wirings can be reduced.

In addition, a conductor 328, a conductor 330, and the like that are connected to the capacitor 600 or the transistor 500 are embedded in the insulator 320, the insulator 322, the insulator 324, and the insulator 326. Note that the conductor 328 and the conductor 330 each have a function of a plug or a wiring. Furthermore, a plurality of conductors functioning as plugs or wirings are collectively denoted by the same reference numeral in some cases. Moreover, in this specification and the like, a wiring and a plug connected to the wiring may be a single component. That is, there are cases where part of a conductor functions as a wiring and part of a conductor functions as a plug.

As a material for each of the plugs and wirings (the conductor 328, the conductor 330, and the like), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, it is preferable to form the plugs and wirings with a low-resistance conductive material such as aluminum or copper. The use of a low-resistance conductive material can reduce wiring resistance.

A wiring layer may be provided over the insulator 326 and the conductor 330. For example, in FIG. 6, an insulator 350, an insulator 352, and an insulator 354 are stacked sequentially. Furthermore, a conductor 356 is formed in the insulator 350, the insulator 352, and the insulator 354. The conductor 356 has a function of a plug or a wiring that is connected to the transistor 550. Note that the conductor 356 can be provided using a material similar to those for the conductor 328 and the conductor 330.

For example, like the insulator 324, the insulator 350 is preferably formed using an insulator having a barrier property against hydrogen. Furthermore, the conductor 356 preferably contains a conductor having a barrier property against hydrogen. In particular, the conductor having a barrier property against hydrogen is formed in an opening portion of the insulator 350 having a barrier property against hydrogen. With this structure, the transistor 550 and the transistor 500 can be separated by a barrier layer, so that diffusion of hydrogen from the transistor 550 into the transistor 500 can be inhibited.

Note that for the conductor having a barrier property against hydrogen, tantalum nitride is preferably used, for example. In addition, by stacking tantalum nitride and tungsten, which has high conductivity, the diffusion of hydrogen from the transistor 550 can be inhibited while the conductivity as a wiring is kept. In that case, a structure in which a tantalum nitride layer having a barrier property against hydrogen is in contact with the insulator 350 having a barrier property against hydrogen is preferable.

A wiring layer may be provided over the insulator 354 and the conductor 356. For example, in FIG. 6, an insulator 360, an insulator 362, and an insulator 364 are stacked sequentially. Furthermore, a conductor 366 is formed in the insulator 360, the insulator 362, and the insulator 364. The conductor 366 has a function of a plug or a wiring. Note that the conductor 366 can be provided using a material similar to those for the conductor 328 and the conductor 330.

For example, like the insulator 324, the insulator 360 is preferably formed using an insulator having a barrier property against hydrogen. Furthermore, the conductor 366 preferably contains a conductor having a barrier property against hydrogen. In particular, the conductor having a barrier property against hydrogen is formed in an opening portion of the insulator 360 having a barrier property against hydrogen. With this structure, the transistor 550 and the transistor 500 can be separated by a barrier layer, so that diffusion of hydrogen from the transistor 550 into the transistor 500 can be inhibited.

A wiring layer may be provided over the insulator 364 and the conductor 366. For example, in FIG. 6, an insulator 370, an insulator 372, and an insulator 374 are stacked sequentially. Furthermore, a conductor 376 is formed in the insulator 370, the insulator 372, and the insulator 374. The conductor 376 has a function of a plug or a wiring. Note that the conductor 376 can be provided using a material similar to those for the conductor 328 and the conductor 330.

For example, like the insulator 324, the insulator 370 is preferably formed using an insulator having a barrier property against hydrogen. Furthermore, the conductor 376 preferably contains a conductor having a barrier property against hydrogen. In particular, the conductor having a barrier property against hydrogen is formed in an opening portion of the insulator 370 having a barrier property against hydrogen. With this structure, the transistor 550 and the transistor 500 can be separated by a barrier layer, so that diffusion of hydrogen from the transistor 550 into the transistor 500 can be inhibited.

A wiring layer may be provided over the insulator 374 and the conductor 376. For example, in FIG. 6, an insulator 380, an insulator 382, and an insulator 384 are stacked sequentially. Furthermore, a conductor 386 is formed in the insulator 380, the insulator 382, and the insulator 384. The conductor 386 has a function of a plug or a wiring. Note that the conductor 386 can be provided using a material similar to those for the conductor 328 and the conductor 330.

For example, like the insulator 324, the insulator 380 is preferably formed using an insulator having a barrier property against hydrogen. Furthermore, the conductor 386 preferably contains a conductor having a barrier property against hydrogen. In particular, the conductor having a barrier property against hydrogen is formed in an opening portion of the insulator 380 having a barrier property against hydrogen. With this structure, the transistor 550 and the transistor 500 can be separated by a barrier layer, so that diffusion of hydrogen from the transistor 550 into the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. Three or less wiring layers that are similar to the wiring layer including the conductor 356 may be provided, or five or more wiring layers that are similar to the wiring layer including the conductor 356 may be provided.

An insulator 510, an insulator 512, an insulator 514, and an insulator 516 are stacked sequentially over the insulator 384. A substance having a barrier property against oxygen or hydrogen is preferably used for any of the insulator 510, the insulator 512, the insulator 514, and the insulator 516.

For example, for the insulator 510 and the insulator 514, it is preferable to use a film having a barrier property against hydrogen or impurities diffused from the substrate 311, a region where the transistor 550 is provided, or the like into the region where the transistor 500 is provided. Thus, a material similar to that for the insulator 324 can be used.

For the film having a barrier property against hydrogen, silicon nitride formed using a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably provided between the transistor 500 and the transistor 550.

In addition, for the film having a barrier property against hydrogen, a metal oxide such as aluminum oxide, hafnium oxide, or tantalum oxide is preferably used for the insulator 510 and the insulator 514, for example.

In particular, aluminum oxide has an excellent blocking effect that prevents the passage of both oxygen and impurities such as hydrogen and moisture which are factors of change in electrical characteristics of the transistor. Accordingly, aluminum oxide can prevent mixing of impurities such as hydrogen and moisture into the transistor 500 in the manufacturing process and after the manufacturing of the transistor. In addition, release of oxygen from the oxide included in the transistor 500 can be inhibited. Therefore, aluminum oxide is suitably used for the protective film of the transistor 500.

In addition, for the insulator 512 and the insulator 516, a material similar to that for the insulator 320 can be used, for example. Furthermore, when a material with a comparatively low permittivity is used for these insulators, parasitic capacitance generated between wirings can be reduced. A silicon oxide film, a silicon oxynitride film, or the like can be used for the insulator 512 and the insulator 516, for example.

Furthermore, a conductor 518, a conductor included in the transistor 500 (e.g., a conductor 503), and the like are embedded in the insulator 510, the insulator 512, the insulator 514, and the insulator 516. Note that the conductor 518 has a function of a plug or a wiring that is connected to the capacitor 600 or the transistor 550. The conductor 518 can be provided using a material similar to those for the conductor 328 and the conductor 330.

In particular, the conductor 518 in a region in contact with the insulator 510 and the insulator 514 is preferably a conductor having a barrier property against oxygen, hydrogen, and water. With this structure, the transistor 550 and the transistor 500 can be separated by a layer having a barrier property against oxygen, hydrogen, and water; thus, diffusion of hydrogen from the transistor 550 into the transistor 500 can be inhibited.

The transistor 500 is provided above the insulator 516.

As illustrated in FIG. 8A and FIG. 8B, the transistor 500 includes the conductor 503 positioned to be embedded in the insulator 514 and the insulator 516; an insulator 520 positioned over the insulator 516 and the conductor 503; an insulator 522 positioned over the insulator 520; an insulator 524 positioned over the insulator 522; an oxide 530a positioned over the insulator 524; an oxide 530b positioned over the oxide 530a; a conductor 542a and a conductor 542b positioned apart from each other over the oxide 530b; an insulator 580 that is positioned over the conductor 542a and the conductor 542b and is provided with an opening formed to overlap with a region between the conductor 542a and the conductor 542b; an insulator 545 positioned on a bottom surface and a side surface of the opening; and a conductor 560 positioned on a formation surface of the insulator 545.

In addition, as illustrated in FIG. 8A and FIG. 8B, an insulator 544 is preferably positioned between the insulator 580 and the oxide 530a, the oxide 530b, the conductor 542a, and the conductor 542b. Furthermore, as illustrated in FIG. 8A and FIG. 8B, the conductor 560 preferably includes a conductor 560a provided inside the insulator 545 and a conductor 560b provided to be embedded inside the conductor 560a. Moreover, as illustrated in FIG. 8A and FIG. 8B, an insulator 574 is preferably positioned over the insulator 580, the conductor 560, and the insulator 545.

Note that in this specification and the like, the oxide 530a and the oxide 530b are sometimes collectively referred to as an oxide 530.

Note that although a structure of the transistor 500 in which two layers of the oxide 530a and the oxide 530b are stacked in a region where a channel is formed and its vicinity is illustrated, the present invention is not limited thereto. For example, it is possible to employ a structure in which a single layer of the oxide 530b or a stacked-layer structure of three or more layers is provided.

Furthermore, although the conductor 560 is illustrated to have a stacked-layer structure of two layers in the transistor 500, the present invention is not limited thereto. For example, the conductor 560 may have a single-layer structure or a stacked-layer structure of three or more layers. Note that the transistors 500 illustrated in FIG. 6, FIG. 7, and FIG. 8A are examples, and the structures are not limited thereto; an appropriate transistor can be used in accordance with a circuit configuration, a driving method, or the like.

Here, the conductor 560 functions as a gate electrode of the transistor, and the conductor 542a and the conductor 542b each function as a source electrode or a drain electrode. As described above, the conductor 560 is formed to be embedded in the opening of the insulator 580 and the region between the conductor 542a and the conductor 542b. The positions of the conductor 560, the conductor 542a, and the conductor 542b with respect to the opening of the insulator 580 are selected in a self-aligned manner. That is, in the transistor 500, the gate electrode can be positioned between the source electrode and the drain electrode in a self-aligned manner. Thus, the conductor 560 can be formed without an alignment margin, resulting in a reduction in the area occupied by the transistor 500. Accordingly, miniaturization and high integration of the semiconductor device can be achieved.

In addition, since the conductor 560 is formed in the region between the conductor 542a and the conductor 542b in a self-aligned manner, the conductor 560 does not have a region overlapping with the conductor 542a or the conductor 542b. Thus, parasitic capacitance formed between the conductor 560 and each of the conductor 542a and the conductor 542b can be reduced. As a result, the switching speed of the transistor 500 can be improved, and the transistor 500 can have high frequency characteristics.

The conductor 560 sometimes functions as a first gate (also referred to as a top gate) electrode. In addition, the conductor 503 sometimes functions as a second gate (also referred to as a bottom gate) electrode. In that case, the threshold voltage of the transistor 500 can be controlled by changing a potential applied to the conductor 503 independently of a potential applied to the conductor 560. In particular, when a negative potential is applied to the conductor 503, the threshold voltage of the transistor 500 can be further increased, and the off-state current can be reduced. Thus, a drain current at the time when a potential applied to the conductor 560 is 0 V can be lower in the case where a negative potential is applied to the conductor 503 than in the case where a negative potential is not applied to the conductor 503.

The conductor 503 is positioned to overlap with the oxide 530 and the conductor 560. Thus, in the case where potentials are applied to the conductor 560 and the conductor 503, an electric field generated from the conductor 560 and an electric field generated from the conductor 503 are connected, so that a channel formation region formed in the oxide 530 can be covered.

In this specification and the like, a transistor structure in which a channel formation region is electrically surrounded by electric fields of a pair of gate electrodes (a first gate electrode and a second gate electrode) is referred to as a surrounded channel (S-channel) structure. The S-channel structure disclosed in this specification and the like is different from a Fin-type structure and a planar structure. With the S-channel structure, resistance to a short-channel effect can be enhanced, that is, a transistor in which a short-channel effect is less likely to occur can be provided.

In addition, the conductor 503 has a structure similar to that of the conductor 518; a conductor 503a is formed in contact with an inner wall of an opening in the insulator 514 and the insulator 516, and a conductor 503b is formed on the inner side. Note that although the transistor 500 having a structure in which the conductor 503a and the conductor 503b are stacked is illustrated, the present invention is not limited thereto. For example, the conductor 503 may be provided as a single layer or to have a stacked-layer structure of three or more layers.

Here, for the conductor 503a, a conductive material that has a function of inhibiting diffusion of impurities such as a hydrogen atom, a hydrogen molecule, a water molecule, and a copper atom (through which the impurities are unlikely to pass) is preferably used. Alternatively, it is preferable to use a conductive material that has a function of inhibiting diffusion of oxygen (e.g., at least one of an oxygen atom, an oxygen molecule, and the like) (through which oxygen is unlikely to pass). Note that in this specification, a function of inhibiting diffusion of impurities or oxygen means a function of inhibiting diffusion of any one or all of the impurities and oxygen.

For example, when the conductor 503a has a function of inhibiting diffusion of oxygen, a reduction in conductivity of the conductor 503b due to oxidation can be inhibited.

In addition, in the case where the conductor 503 also functions as a wiring, a conductive material with high conductivity that contains tungsten, copper, or aluminum as its main component is preferably used for the conductor 503b. Note that although the conductor 503 has a stacked layer of the conductor 503a and the conductor 503b in this embodiment, the conductor 503 may have a single-layer structure.

The insulator 520, the insulator 522, and the insulator 524 have a function of a second gate insulating film.

Here, as the insulator 524 that is in contact with the oxide 530, an insulator that contains oxygen more than oxygen in the stoichiometric composition is preferably used. Such oxygen is easily released from the insulator by heating. In this specification and the like, oxygen released by heating is sometimes referred to as "excess oxygen". That is, a region containing excess oxygen (also referred to as an "excess-oxygen region") is preferably formed in the insulator 524. When such an insulator containing excess oxygen is provided in contact with the oxide 530, oxygen vacancies (Vo) in the oxide 530 can be reduced and the reliability of the transistor 500 can be improved. When hydrogen enters the oxygen vacancies in the oxide 530, such defects (hereinafter, referred to as VoH in some cases) serve as donors and generate electrons serving as carriers in some cases. In other cases, bonding of part of hydrogen to oxygen bonded to a metal atom generates electrons serving as carriers. Thus, a transistor using an oxide semiconductor that contains a large amount of hydrogen is likely to have normally-on characteristics. Moreover, hydrogen in an oxide semiconductor is easily transferred by a stress such as heat or an electric field; thus, a large amount of hydrogen in an oxide semiconductor might reduce the reliability of the transistor. In one embodiment of the present invention, VoH in the oxide 530 is preferably reduced as much as possible so that the oxide 530 becomes a highly purified intrinsic or substantially highly purified intrinsic oxide. It is important to remove impurities such as moisture or hydrogen in an oxide semiconductor (sometimes referred to as "dehydration" or "dehydrogenation treatment") and to compensate for oxygen vacancies by supplying oxygen to the oxide semiconductor (sometimes referred to as "oxygen adding treatment") in order to obtain an oxide semiconductor whose VoH is sufficiently reduced. When an oxide semiconductor with sufficiently reduced VoH is used for a channel formation region of a transistor, the transistor can have stable electrical characteristics.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably within the range of 100° C. to 700° C., or 100° C. to 400° C.

One or more of heat treatment, microwave treatment, and RF treatment may be performed in a state in which the insulator including the excess-oxygen region and the oxide 530 are in contact with each other. By the treatment, water or hydrogen in the oxide 530 can be removed. For example, in the oxide 530, dehydrogenation can be performed when a reaction in which a bond of VoH is cut occurs, i.e., a reaction of "VoH→Vo+H" occurs. Part of hydrogen generated at this time is bonded to oxygen to be H$_2$O, and removed from the oxide 530 or an insulator near the oxide 530 in some cases. Some hydrogen may be gettered into the conductor 542a and/or the conductor 542b in some cases.

For the microwave treatment, for example, an apparatus including a power supply that generates high-density plasma or an apparatus including a power supply that applies RF to the substrate side is suitably used. For example, the use of an oxygen-containing gas and high-density plasma enables high-density oxygen radicals to be generated, and application of the RF to the substrate side allows the oxygen radicals generated by the high-density plasma to be efficiently introduced into the oxide 530 or an insulator in the vicinity of the oxide 530. The pressure in the microwave treatment is higher than or equal to 133 Pa, preferably higher than or equal to 200 Pa, further preferably higher than or equal to 400 Pa. As a gas introduced into an apparatus for performing the microwave treatment, for example, oxygen and argon are used and the oxygen flow rate ratio ($O_2/(O_2+Ar)$) is lower than or equal to 50%, preferably higher than or equal to 10% and lower than or equal to 30%.

In a manufacturing process of the transistor 500, heat treatment is preferably performed with the surface of the oxide 530 exposed. The heat treatment is performed at higher than or equal to 100° C. and lower than or equal to 450° C., preferably higher than or equal to 350° C. and lower than or equal to 400° C., for example. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 530 to reduce oxygen vacancies (Vo). The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas or inert gas atmosphere.

Note that the oxygen adding treatment performed on the oxide 530 can promote a reaction in which oxygen vacancies in the oxide 530 are filled with supplied oxygen, i.e., a reaction of "Vo+O→null". Furthermore, hydrogen remaining in the oxide 530 reacts with supplied oxygen, so that the hydrogen can be removed as $H_2O$ (dehydration). This can inhibit recombination of hydrogen remaining in the oxide 530 with oxygen vacancies and formation of VoH.

In addition, in the case where the insulator 524 includes an excess-oxygen region, it is preferable that the insulator 522 have a function of inhibiting diffusion of oxygen (e.g., an oxygen atom, an oxygen molecule, or the like) (through which oxygen is unlikely to pass).

When the insulator 522 has a function of inhibiting diffusion of oxygen or impurities, oxygen contained in the oxide 530 is not diffused into the insulator 520 side, which is preferable. Furthermore, the conductor 503 can be inhibited from reacting with oxygen contained in the insulator 524 or the oxide 530.

For the insulator 522, a single layer or stacked layers of an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or (Ba,Sr)$TiO_3$ (BST) are preferably used, for example. As miniaturization and high integration of transistors progress, a problem such as leakage current might arise because of a thinner gate insulating film. When a high-k material is used for an insulator functioning as the gate insulating film, a gate potential during transistor operation can be reduced while the physical thickness is maintained.

It is particularly preferable to use an insulator containing an oxide of one or both of aluminum and hafnium, which is an insulating material having a function of inhibiting diffusion of impurities, oxygen, and the like (through which oxygen is unlikely to pass). Aluminum oxide, hafnium oxide, an oxide containing aluminum and hafnium (hafnium aluminate), or the like is preferably used as the insulator containing an oxide of one or both of aluminum and hafnium. In the case where the insulator 522 is formed using such a material, the insulator 522 functions as a layer that inhibits release of oxygen from the oxide 530 and mixing of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. The insulator over which silicon oxide, silicon oxynitride, or silicon nitride is stacked may be used.

In addition, it is preferable that the insulator 520 be thermally stable. For example, silicon oxide and silicon oxynitride are suitable because they are thermally stable. Furthermore, the combination of an insulator that is a high-k material and silicon oxide or silicon oxynitride enables the insulator 520 to have a stacked-layer structure that has thermal stability and a high dielectric constant.

Note that in the transistor 500 in FIG. 8A and FIG. 8B, the insulator 520, the insulator 522, and the insulator 524 are illustrated as the second gate insulating film having a stacked-layer structure of three layers; however, the second gate insulating film may be a single layer or may have a stacked-layer structure of two layers or four or more layers. In such cases, without limitation to a stacked-layer structure formed of the same material, a stacked-layer structure formed of different materials may be employed.

In the transistor 500, a metal oxide functioning as an oxide semiconductor is preferably used as the oxide 530 including a channel formation region. For example, as the oxide 530, a metal oxide such as an In—M—Zn oxide (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used.

The metal oxide functioning as an oxide semiconductor may be formed by a sputtering method or an ALD (Atomic Layer Deposition) method. Note that the metal oxide functioning as an oxide semiconductor is described in detail in another embodiment.

Furthermore, the metal oxide functioning as the channel formation region in the oxide 530 has a band gap of more than or equal to 2 eV, preferably more than or equal to 2.5 eV. With the use of a metal oxide having such a wide bandgap, the off-state current of the transistor can be reduced.

When the oxide 530 includes the oxide 530a under the oxide 530b, it is possible to inhibit diffusion of impurities into the oxide 530b from the components formed below the oxide 530a.

Note that the oxide 530 preferably has a stacked-layer structure of a plurality of oxide layers that differ in the atomic ratio of metal atoms. Specifically, the atomic ratio of the element M to the constituent elements in the metal oxide used as the oxide 530a is preferably higher than the atomic ratio of the element M to the constituent elements in the metal oxide used as the oxide 530b. In addition, the atomic ratio of the element M to In in the metal oxide used as the oxide 530a is preferably higher than the atomic ratio of the element M to In in the metal oxide used as the oxide 530b. Furthermore, the atomic ratio of In to the element M in the metal oxide used as the oxide 530b is preferably higher than the atomic ratio of In to the element M in the metal oxide used as the oxide 530a.

In addition, the energy of the conduction band minimum of the oxide 530a is preferably higher than the energy of the conduction band minimum of the oxide 530b. In other words, the electron affinity of the oxide 530a is preferably smaller than the electron affinity of the oxide 530b.

Here, the energy level of the conduction band minimum gradually changes at a junction portion of the oxide 530a and the oxide 530b. In other words, the energy level of the conduction band minimum at the junction portion of the oxide 530a and the oxide 530b continuously changes or is continuously connected. To obtain this, the density of defect state in a mixed layer formed at an interface between the oxide 530a and the oxide 530b is preferably made low.

Specifically, when the oxide 530a and the oxide 530b contain a common element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like is preferably used as the oxide 530a.

At this time, the oxide 530b serves as a main carrier path. When the oxide 530a has the above structure, the density of defect states at the interface between the oxide 530a and the oxide 530b can be made low. Thus, the influence of interface scattering on carrier conduction is small, and the transistor 500 can have a high on-state current.

The conductor 542a and the conductor 542b functioning as the source electrode and the drain electrode are provided over the oxide 530b. For the conductor 542a and conductor 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a metal nitride film of tantalum nitride or the like is preferable because it has a barrier property against hydrogen or oxygen.

In addition, although the conductor 542a and the conductor 542b each having a single-layer structure are illustrated in FIG. 8A, a stacked-layer structure of two or more layers may be employed. For example, it is preferable to stack a tantalum nitride film and a tungsten film. Alternatively, a titanium film and an aluminum film may be stacked. Alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

Other examples include a three-layer structure where a titanium film or a titanium nitride film is formed, an aluminum film or a copper film is stacked over the titanium film or the titanium nitride film, and a titanium film or a titanium nitride film is formed over the aluminum film or the copper film; and a three-layer structure where a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

In addition, as illustrated in FIG. 8A, a region 543a and a region 543b are sometimes formed as low-resistance regions at an interface between the oxide 530 and the conductor 542a (the conductor 542b) and in the vicinity of the interface. In that case, the region 543a functions as one of a source region and a drain region, and the region 543b functions as the other of the source region and the drain region. Furthermore, the channel formation region is formed in a region between the region 543a and the region 543b.

When the conductor 542a (the conductor 542b) is provided to be in contact with the oxide 530, the oxygen concentration in the region 543a (the region 543b) sometimes decreases. In addition, a metal compound layer that contains the metal contained in the conductor 542a (the conductor 542b) and the component of the oxide 530 is sometimes formed in the region 543a (the region 543b). In such a case, the carrier density of the region 543a (the region 543b) increases, and the region 543a (the region 543b) becomes a low-resistance region.

The insulator 544 is provided to cover the conductor 542a and the conductor 542b and inhibits oxidation of the conductor 542a and the conductor 542b. At this time, the insulator 544 may be provided to cover a side surface of the oxide 530 and to be in contact with the insulator 524.

A metal oxide containing one kind or two or more kinds selected from hafnium, aluminum, gallium, yttrium, zirconium, tungsten, titanium, tantalum, nickel, germanium, neodymium, lanthanum, magnesium, and the like can be used as the insulator 544. Alternatively, silicon nitride oxide, silicon nitride, or the like can be used for the insulator 544.

It is particularly preferable to use an insulator containing an oxide of one or both of aluminum and hafnium, such as aluminum oxide, hafnium oxide, or an oxide containing aluminum and hafnium (hafnium aluminate), as the insulator 544. In particular, hafnium aluminate has higher heat resistance than a hafnium oxide film. Therefore, hafnium aluminate is preferable because it is less likely to be crystallized by heat treatment in a later step. Note that the insulator 544 is not an essential component when the conductor 542a and the conductor 542b are oxidation-resistant materials or do not significantly lose their conductivity even after absorbing oxygen. Design is appropriately set in consideration of required transistor characteristics.

When the insulator 544 is included, diffusion of impurities such as water and hydrogen contained in the insulator 580 into the oxide 530b through the insulator 545 can be inhibited. Furthermore, oxidation of the conductor 560 due to excess oxygen contained in the insulator 580 can be inhibited.

The insulator 545 functions as a first gate insulating film Like the insulator 524, the insulator 545 is preferably formed using an insulator that contains excess oxygen and releases oxygen by heating.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride are preferable because they are thermally stable.

When an insulator containing excess oxygen is provided as the insulator 545, oxygen can be effectively supplied from the insulator 545 to the channel formation region of the oxide 530b. Furthermore, as in the insulator 524, the concentration of impurities such as water or hydrogen in the insulator 545 is preferably reduced. The thickness of the insulator 545 is preferably greater than or equal to 1 nm and less than or equal to 20 nm.

Furthermore, to efficiently supply excess oxygen contained in the insulator 545 to the oxide 530, a metal oxide may be provided between the insulator 545 and the conductor 560. The metal oxide preferably inhibits diffusion of oxygen from the insulator 545 into the conductor 560. Providing the metal oxide that inhibits diffusion of oxygen inhibits diffusion of excess oxygen from the insulator 545 into the conductor 560. That is, reduction in the amount of excess oxygen supplied to the oxide 530 can be inhibited. Moreover, oxidation of the conductor 560 due to excess oxygen can be inhibited. For the metal oxide, a material that can be used for the insulator 544 is used.

Note that the insulator 545 may have a stacked-layer structure like the second gate insulating film. As miniaturization and high integration of transistors progress, a problem such as leakage current might arise because of a thinner gate insulating film. For that reason, when the insulator functioning as the gate insulating film has a stacked-layer structure of a high-k material and a thermally stable material, a gate potential during transistor operation can be reduced while the physical thickness is maintained. Furthermore, the stacked-layer structure can be thermally stable and have a high relative permittivity.

Although the conductor 560 that functions as the first gate electrode and has a two-layer structure is illustrated in FIG. 8A and FIG. 8B, a single-layer structure or a stacked-layer structure of three or more layers may be employed.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material having a function of inhibiting diffusion of oxygen (e.g., at least one of an oxygen atom, an oxygen molecule, and the like). When the conductor 560a has a function of inhibiting diffusion of oxygen, it is possible to inhibit a reduction in conductivity of the conductor 560b due to oxidation caused by oxygen contained in the insulator 545. As a conductive material having a function of inhibiting diffusion of oxygen, for example, tantalum, tantalum nitride, ruthenium, ruthenium oxide, or the like is preferably used. For the conductor 560a, the oxide semiconductor that can be used as the oxide 530 can be used. In that case, when the conductor 560b is deposited using a sputtering method, the conductor 560a can have a reduced value of electrical resistance to be a conductor. Such a conductor can be referred to as an OC (Oxide Conductor) electrode.

In addition, a conductive material containing tungsten, copper, or aluminum as its main component is preferably used for the conductor 560b. Furthermore, the conductor 560b also functions as a wiring and thus a conductor having high conductivity is preferably used as the conductor 560b. For example, a conductive material containing tungsten, copper, or aluminum as its main component can be used. The conductor 560b may have a stacked-layer structure, for example, a stacked-layer structure of any of the above conductive materials and titanium or titanium nitride.

The insulator 580 is provided over the conductor 542a and the conductor 542b with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, resin, or the like. In particular, silicon oxide and silicon oxynitride are preferable because they are thermally stable. In particular, silicon oxide and porous silicon oxide are preferable because an excess-oxygen region can be easily formed in a later step.

The insulator 580 preferably includes an excess-oxygen region. When the insulator 580 that releases oxygen by heating is provided, oxygen in the insulator 580 can be efficiently supplied to the oxide 530. Note that the concentration of impurities such as water or hydrogen in the insulator 580 is preferably reduced.

The opening of the insulator 580 is formed to overlap with the region between the conductor 542a and the conductor 542b. Accordingly, the conductor 560 is formed to be embedded in the opening of the insulator 580 and the region between the conductor 542a and the conductor 542b.

The gate length needs to be short for miniaturization of the semiconductor device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening of the insulator 580; thus, even when the conductor 560 has a shape with a high aspect ratio, the conductor 560 can be formed without collapsing during the process.

The insulator 574 is preferably provided in contact with a top surface of the insulator 580, a top surface of the conductor 560, and a top surface of the insulator 545. When the insulator 574 is deposited using a sputtering method, excess-oxygen regions can be provided in the insulator 545 and the insulator 580. Accordingly, oxygen can be supplied from the excess-oxygen regions to the oxide 530.

For example, a metal oxide containing one kind or two or more kinds selected from hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness of greater than or equal to 0.5 nm and less than or equal to 3.0 nm can inhibit diffusion of hydrogen and nitrogen. Accordingly, aluminum oxide deposited by a sputtering method serves as an oxygen supply source and can also have a function of a barrier film against impurities such as hydrogen.

In addition, an insulator 581 functioning as an interlayer film is preferably provided over the insulator 574. As in the insulator 524 or the like, the concentration of impurities such as water or hydrogen in the insulator 581 is preferably reduced.

Furthermore, a conductor 540a and a conductor 540b are positioned in openings formed in the insulator 581, the insulator 574, the insulator 580, and the insulator 544. The conductor 540a and the conductor 540b are provided to face each other with the conductor 560 therebetween. The structures of the conductor 540a and the conductor 540b are similar to a structure of a conductor 546 and a conductor 548 that are described later.

An insulator 582 is provided over the insulator 581. A substance having a barrier property against oxygen or hydrogen is preferably used for the insulator 582. Therefore, a material similar to that for the insulator 514 can be used for the insulator 582. For the insulator 582, a metal oxide such as aluminum oxide, hafnium oxide, or tantalum oxide is preferably used, for example.

In particular, aluminum oxide has an excellent blocking effect that prevents the passage of both oxygen and impurities such as hydrogen and moisture which are factors of change in electrical characteristics of the transistor. Accordingly, aluminum oxide can prevent mixing of impurities such as hydrogen and moisture into the transistor 500 in the manufacturing process and after the manufacturing of the transistor. In addition, release of oxygen from the oxide included in the transistor 500 can be inhibited. Therefore, aluminum oxide is suitably used for the protective film of the transistor 500.

In addition, an insulator 586 is provided over the insulator 582. For the insulator 586, a material similar to that for the insulator 320 can be used. Furthermore, when a material with a comparatively low permittivity is used for these insulators, parasitic capacitance generated between wirings can be reduced. A silicon oxide film, a silicon oxynitride film, or the like can be used for the insulator 586, for example.

Furthermore, the conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 have functions of plugs or wirings that are connected to the capacitor 600, the transistor 500, or the transistor 550. The conductor 546 and the conductor 548 can be provided using materials similar to those for the conductor 328 and the conductor 330.

After the transistor 500 is formed, an opening may be formed to surround the transistor 500 and an insulator having a high barrier property against hydrogen or water may be formed to cover the opening Surrounding the transistor 500 with the insulator having a high barrier property can prevent entry of moisture and hydrogen from the outside. Alternatively, a plurality of transistors 500 may be collectively surrounded by the insulator having a high barrier property against hydrogen or water. When an opening is formed to surround the transistor 500, for example, the formation of an opening reaching the insulator 522 or the insulator 514 and the formation of the insulator having a high barrier property in contact with the insulator 522 or the insulator 514 are suitable because these formation steps can also serve as part of the manufacturing steps of the transistor 500. The insulator having a high barrier property against hydrogen or water is formed using a material similar to that for the insulator 522 or the insulator 514, for example.

Next, the capacitor 600 is provided above the transistor 500. The capacitor 600 includes a conductor 610, a conductor 620, and an insulator 630.

In addition, a conductor 612 may be provided over the conductor 546 and the conductor 548. The conductor 612 has a function of a plug or a wiring that is connected to the transistor 500. The conductor 610 has a function of an electrode of the capacitor 600. Note that the conductor 612 and the conductor 610 can be formed at the same time.

For the conductor 612 and the conductor 610, a metal film containing an element selected from molybdenum, titanium, tantalum, tungsten, aluminum, copper, chromium, neodymium, and scandium; a metal nitride film containing the above element as its component (a tantalum nitride film, a titanium nitride film, a molybdenum nitride film, or a tungsten nitride film); or the like can be used. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Although the conductor 612 and the conductor 610 each having a single-layer structure are shown in this embodiment, the structure is not limited thereto; a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided to overlap with the conductor 610 with the insulator 630 therebetween. Note that a conductive material such as a metal material, an alloy material, or a metal oxide material can be used for the conductor 620. It is preferable to use a high-melting-point material that has both heat resistance and conductivity, such as tungsten or molybdenum, and it is particularly preferable to use tungsten. In addition, in the case where the conductor 620 is formed concurrently with another component such as a conductor, Cu (copper), Al (aluminum), or the like, which is a low-resistance metal material, is used.

An insulator 640 is provided over the conductor 620 and the insulator 630. The insulator 640 can be provided using a material similar to that for the insulator 320. In addition, the insulator 640 may function as a planarization film that covers an uneven shape therebelow.

With the use of this structure, a semiconductor device using a transistor including an oxide semiconductor can be miniaturized or highly integrated.

Examples of a substrate that can be used for the semiconductor device of one embodiment of the present invention include a glass substrate, a quartz substrate, a sapphire substrate, a ceramic substrate, a metal substrate (e.g., a stainless steel substrate, a substrate including stainless steel foil, a tungsten substrate, and a substrate including tungsten foil), a semiconductor substrate (e.g., a single crystal semiconductor substrate, a polycrystalline semiconductor substrate, and a compound semiconductor substrate), and an SOI (Silicon on Insulator) substrate. Alternatively, a plastic substrate having heat resistance to the processing temperature in this embodiment may be used. Examples of a glass substrate include a barium borosilicate glass substrate, an aluminosilicate glass substrate, an aluminoborosilicate glass substrate, and a soda lime glass substrate. Alternatively, crystallized glass or the like can be used.

Alternatively, a flexible substrate, an attachment film, paper including a fibrous material, a base film, or the like can be used as the substrate. As examples of the flexible substrate, the attachment film, the base material film, and the like, the following can be given. Examples include plastics typified by polyethylene terephthalate (PET), polyethylene naphthalate (PEN), polyether sulfone (PES), and polytetrafluoroethylene (PTFE). Another example is a synthetic resin such as acrylic. Other examples are polypropylene, polyester, polyvinyl fluoride, and polyvinyl chloride. Other examples are polyamide, polyimide, an aramid resin, an epoxy resin, an inorganic vapor deposition film, and paper. In particular, the use of a semiconductor substrate, a single crystal substrate, an SOI substrate, or the like enables the manufacture of small-sized transistors with a small variation in characteristics, size, shape, or the like and with high current capability. When a circuit is formed with such transistors, lower power consumption of the circuit or higher integration of the circuit can be achieved.

A flexible substrate may be used as the substrate, and a transistor, a resistor, a capacitor, and/or the like may be formed directly over the flexible substrate. Alternatively, a separation layer may be provided between the substrate and the transistor, the resistor, the capacitor, and/or the like. After part or the whole of a semiconductor device is completed over the separation layer, the separation layer can be used for separation from the substrate and transfer to another substrate. In such a case, the transistor, the resistor, the capacitor, and/or the like can be transferred to a substrate having low heat resistance or a flexible substrate. As the separation layer, a stack of inorganic films, namely a tungsten film and a silicon oxide film, an organic resin film of polyimide or the like formed over a substrate, or a silicon film containing hydrogen can be used, for example.

That is, a semiconductor device may be formed over one substrate and then transferred to another substrate. Examples of a substrate to which a semiconductor device is transferred include, in addition to the above-described substrates over which transistors can be formed, a paper substrate, a cellophane substrate, an aramid film substrate, a polyimide film substrate, a stone substrate, a wood substrate, a cloth substrate (including a natural fiber (silk, cotton, or hemp), a synthetic fiber (nylon, polyurethane, or polyester), a regenerated fiber (acetate, cupro, rayon, or regenerated polyester), or the like), a leather substrate, and a rubber substrate. With the use of any of these substrates, a flexible semiconductor device or a highly durable semiconductor device can be manufactured, high heat resistance can be provided, or a reduction in weight or thickness can be achieved.

Providing a semiconductor device over a flexible substrate can suppress an increase in weight and can produce a non-breakable semiconductor device.

<Modification Example 1 of Transistor>

Figure 9A:
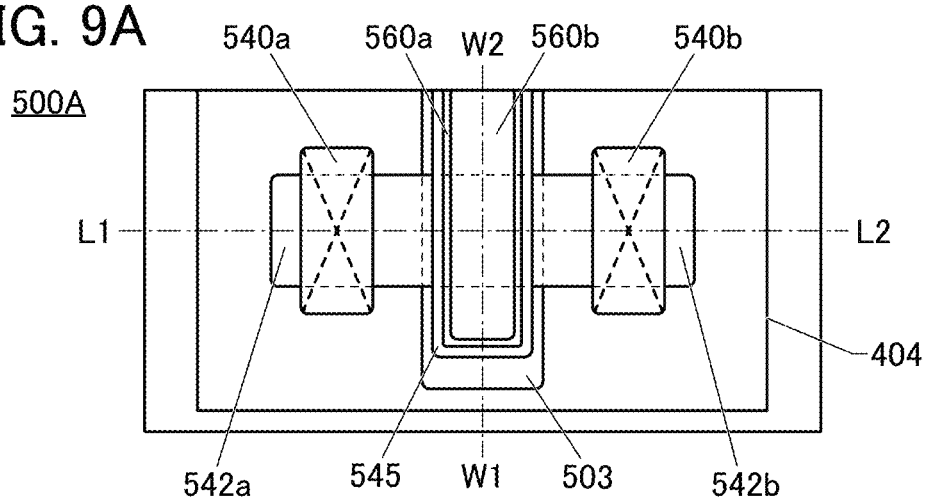
FIG. 9A, FIG. 9B, and FIG. 9C are diagrams showing structure examples of a transistor.
Figure 9B:
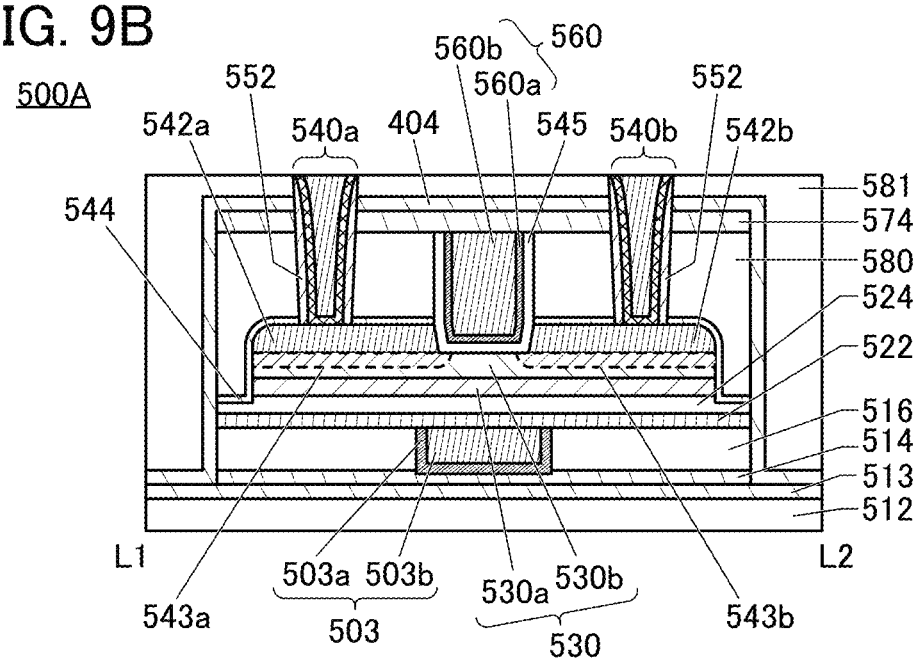
Figure 9C:
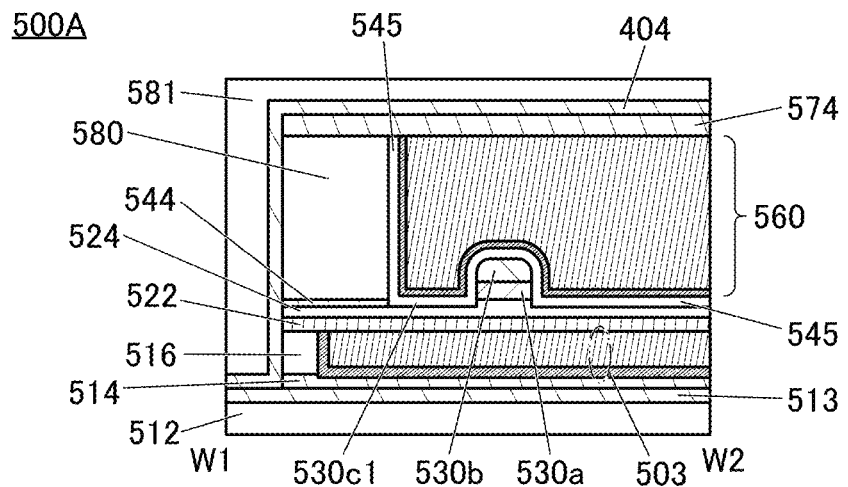

A transistor 500A illustrated in FIG. 9A, FIG. 9B, and FIG. 9C is a modification example of the transistor 500 having the structure illustrated in FIG. 8A and FIG. 8B. FIG. 9A is a top view of the transistor 500A, FIG. 9B is a cross-sectional view of the transistor 500A in the channel length direction, and FIG. 9C is a cross-sectional view of the transistor 500A in the channel width direction. Note that for clarity of the drawing, some components are not illustrated in the top view of FIG. 9A. The structure illustrated in FIG. 9A, FIG. 9B, and FIG. 9C can also be used for other transistors such as the transistor 550 included in the semiconductor device of one embodiment of the present invention.

The transistor 500A having the structure illustrated in FIG. 9A, FIG. 9B, and FIG. 9C is different from the transistor 500 having the structure illustrated in FIG. 8A and FIG. 8B in that an insulator 552, an insulator 513, and an insulator 404 are included. Furthermore, the transistor 500A is different from the transistor 500 having the structure illustrated in FIG. 8A and FIG. 8B in that the insulator 552 is provided in contact with a side surface of the conductor 540a and a side surface of the conductor 540b. Moreover, the transistor 500A is different from the transistor 500 having the structure illustrated in FIG. 8A and FIG. 8B in that the insulator 520 is not included.

In the transistor 500A having the structure illustrated in FIG. 9A, FIG. 9B, and FIG. 9C, the insulator 513 is provided over the insulator 512. The insulator 404 is provided over the insulator 574 and the insulator 513.

In the transistor 500A having the structure illustrated in FIG. 9A, FIG. 9B, and FIG. 9C, the insulator 514, the insulator 516, the insulator 522, the insulator 524, the insulator 544, the insulator 580, and the insulator 574 are patterned and covered with the insulator 404. That is, the insulator 404 is in contact with a top surface of the insulator 574, a side surface of the insulator 574, a side surface of the insulator 580, a side surface of the insulator 544, a side surface of the insulator 524, a side surface of the insulator 522, a side surface of the insulator 516, a side surface of the insulator 514, and a top surface of the insulator 513. Thus, the oxide 530 and the like are isolated from the outside by the insulator 404 and the insulator 513.

The insulator 513 and the insulator 404 preferably have high capability of inhibiting diffusion of hydrogen (e.g., at least one of a hydrogen atom, a hydrogen molecule, and the like) or a water molecule. For example, for the insulator 513 and the insulator 404, silicon nitride or silicon nitride oxide that is a material having a high hydrogen barrier property is preferably used. This can inhibit diffusion of hydrogen or the like into the oxide 530, thereby suppressing the degradation of the characteristics of the transistor 500A. Consequently, the reliability of the semiconductor device of one embodiment of the present invention can be increased.

The insulator 552 is provided in contact with the insulator 581, the insulator 404, the insulator 574, the insulator 580, and the insulator 544. The insulator 552 preferably has a function of inhibiting diffusion of hydrogen or water molecules. For example, for the insulator 552, an insulator such as silicon nitride, aluminum oxide, or silicon nitride oxide that is a material having a high hydrogen barrier property is preferably used. In particular, it is preferable to use silicon nitride as the insulator 552 because of its high hydrogen barrier property. The use of a material having a high hydrogen barrier property for the insulator 552 can inhibit diffusion of impurities such as water and hydrogen from the insulator 580 and the like into the oxide 530 through the conductor 540a and the conductor 540b. Furthermore, oxygen contained in the insulator 580 can be inhibited from being absorbed by the conductor 540a and the conductor 540b. As described above, the reliability of the semiconductor device of one embodiment of the present invention can be increased.

<Modification Example 2 of Transistor>

Figure 10A:
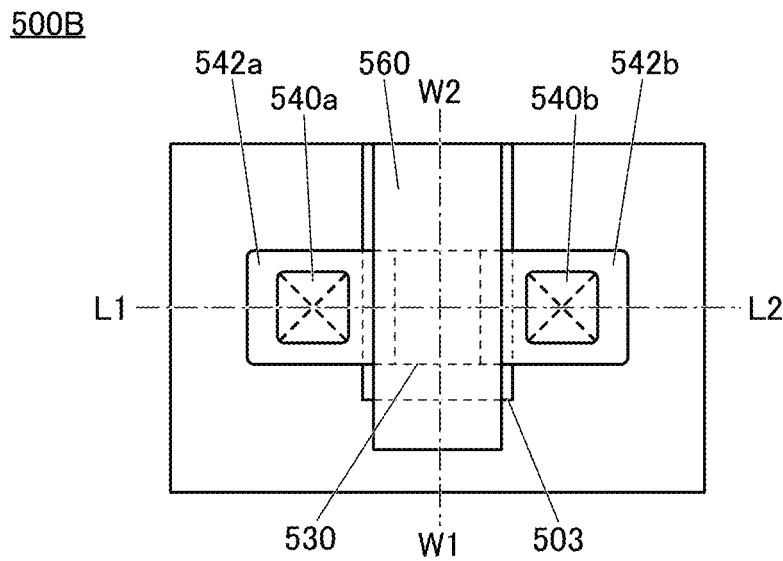
FIG. 10A, FIG. 10B, and FIG. 10C are diagrams showing structure examples of a transistor.
Figure 10B:
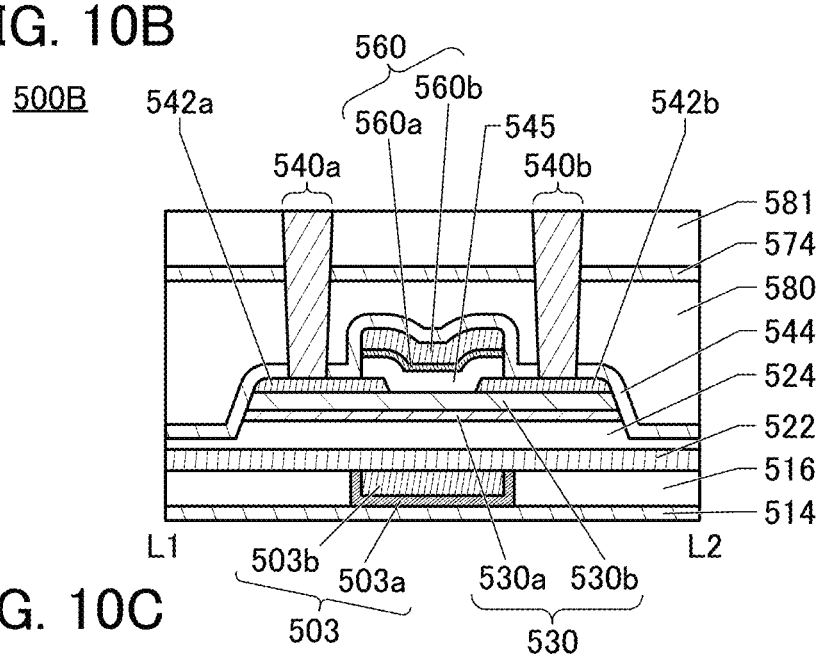
Figure 10C:
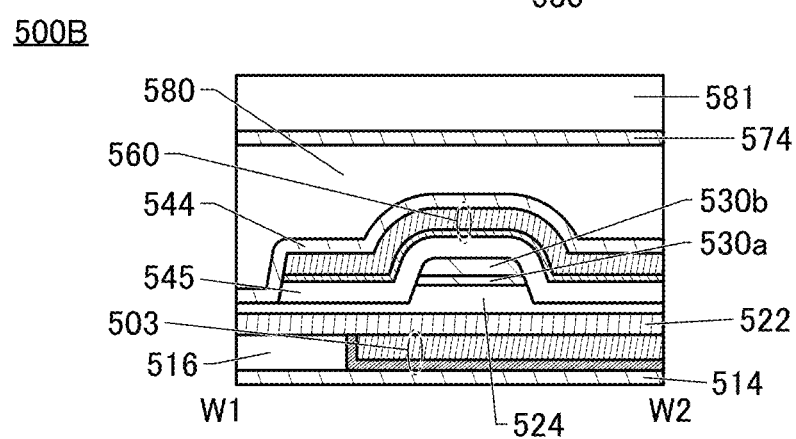

A structure example of a transistor 500B is described with reference to FIG. 10A, FIG. 10B, and FIG. 10C. FIG. 10A is a top view of the transistor 500B. FIG. 10B is a cross-sectional view of a portion indicated by dashed-dotted line L1-L2 in FIG. 10A. FIG. 10C is a cross-sectional view of a portion indicated by dashed-dotted line W1-W2 in FIG. 10A. Note that for clarity of the drawing, some components are not illustrated in the top view of FIG. 10A.

The transistor 500B is a modification example of the transistor 500 and can be replaced with the transistor 500. Accordingly, in order to avoid repeated description, differences of the transistor 500B from the transistor 500 are mainly described.

The conductor 560 functioning as a first gate electrode includes the conductor 560a and the conductor 560b over the conductor 560a. For the conductor 560a, a conductive material that has a function of inhibiting diffusion of impurities such as a hydrogen atom, a hydrogen molecule, a water molecule, and a copper atom is preferably used. Alternatively, it is preferable to use a conductive material having a function of inhibiting diffusion of oxygen (e.g., at least one of an oxygen atom, an oxygen molecule, and the like).

When the conductor 560a has a function of inhibiting diffusion of oxygen, the range of choices for the material of the conductor 560b can be extended. That is, the conductor 560a inhibits oxidation of the conductor 560b, thereby preventing the decrease in conductivity.

The insulator 544 is preferably provided to cover the top surface and a side surface of the conductor 560 and a side surface of the insulator 545. For the insulator 544, an insulating material having a function of inhibiting diffusion of oxygen and impurities such as water and hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide or silicon nitride oxide, silicon nitride, or the like.

The insulator 544 can inhibit oxidation of the conductor 560. Moreover, the insulator 544 can inhibit diffusion of impurities such as water and hydrogen contained in the insulator 580 into the transistor 500B.

The transistor 500B has the conductor 560 overlapping part of the conductor 542a and part of the conductor 542b, and thus tends to have larger parasitic capacitance than the transistor 500. Consequently, the transistor 500B tends to have a lower operating frequency than the transistor 500. However, the transistor 500B does not require steps of providing an opening in the insulator 580 and the like and embedding the conductor 560, the insulator 545, and the like in the opening; hence, the productivity of the transistor 500B is higher than that of the transistor 500.

The composition, structure, method, and the like described in this embodiment can be used in combination as appropriate with the compositions, structures, methods, and the like described in the other embodiments, the example, and the like.

Embodiment 5

In this embodiment, an oxide semiconductor which is a kind of metal oxides is described.

The metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

<Classification of Crystal Structure>

First, the classification of the crystal structures of an oxide semiconductor is described with reference to FIG. 11A. FIG. 11A is a diagram showing classification of crystal structures of an oxide semiconductor, typically IGZO (a metal oxide containing In, Ga, and Zn).

As shown in FIG. 11A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (cloud-aligned composite). Note that the term "Crystalline" excludes single crystal, poly crystal, and completely amorphous. The term "Crystal" includes single crystal and poly crystal.

Note that the structures in the thick frame in FIG. 11A are in an intermediate state between "Amorphous" and "Crystal", and belong to a new crystalline phase. That is, these structures are completely different from "Amorphous", which is energetically unstable, and "Crystal".

A crystal structure of a film or a substrate can be analyzed with an X-ray diffraction (XRD) spectrum. Here, FIG. 11B shows an XRD spectrum, which is obtained by GIXD (Grazing-Incidence XRD) measurement, of a CAAC-IGZO film classified into "Crystalline". Note that a GIXD method is also referred to as a thin film method or a Seemann-Bohlin method. The XRD spectrum that is shown in FIG. 11B and obtained by GIXD measurement is hereinafter simply referred to as an XRD spectrum. The CAAC-IGZO film in FIG. 11B has a composition in the vicinity of In:Ga:Zn=4:2:3 [atomic ratio]. The CAAC-IGZO film in FIG. 11B has a thickness of 500 nm.

As shown in FIG. 11B, a clear peak indicating crystallinity is detected in the XRD spectrum of the CAAC-IGZO film Specifically, a peak indicating c-axis alignment is detected at 2θ of around 31° in the XRD spectrum of the CAAC-IGZO film. As shown in FIG. 11B, the peak at 2θ of around 31° is asymmetric with respect to the axis of the angle at which the peak intensity is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 11C shows a diffraction pattern of the CAAC-IGZO film. FIG. 11C shows a diffraction pattern obtained with the NBED method in which an electron beam is incident in the direction parallel to the substrate. The composition of the CAAC-IGZO film in FIG. 11C is In:Ga:Zn=4:2:3 [atomic ratio] or the neighborhood thereof. In the nanobeam electron diffraction method, electron diffraction is performed with a probe diameter of 1 nm.

As shown in FIG. 11C, a plurality of spots indicating c-axis alignment are observed in the diffraction pattern of the CAAC-IGZO film.

<<Structure of Oxide Semiconductor>>

Oxide semiconductors might be classified in a manner different from that in FIG. 11A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In—M—Zn oxide (the element M is one or more kinds selected from aluminum, gallium, yttrium, tin, titanium, and the like), the CAAC-OS tends to have a layered crystal structure (also referred to as a stacked-layer structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called polycrystal. It is highly probable that the grain boundary becomes a recombination center and captures carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, reduction in electron mobility due to the grain boundary is less likely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor with some analysis methods. For example, when an nc-OS film is subjected to structural analysis using out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., 1 nm or larger and 30 nm or smaller).

[a-like OS]

The a-like OS is an oxide semiconductor having a structure between those of the nc-OS and the amorphous oxide semiconductor. The a-like OS has a void or a low-density region. That is, the a-like OS has low crystallinity as compared with the nc-OS and the CAAC-OS. Moreover, the a-like OS has higher hydrogen concentration in the film than the nc-OS and the CAAC-OS.

<<Structure of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. For example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. A CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, a high on-state current ($I_{on}$), a high field-effect mobility ($\mu$), and favorable switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor with a low carrier concentration is preferably used for the transistor. For example, the carrier concentration of an oxide semiconductor is lower than or equal to $1 \times 10^{17}$ cm$^{-3}$, preferably lower than or equal to $1 \times 10^{15}$ cm$^{-3}$, further preferably lower than or equal to $1 \times 10^{13}$ cm$^{-3}$, still further preferably lower than or equal to $1 \times 10^{11}$ cm$^{-3}$, yet further preferably lower than $1 \times 10^{10}$ cm$^{-3}$, and higher than or equal to $1 \times 10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2 \times 10^{18}$ atoms/cm$^3$, preferably lower than or equal to $2 \times 10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained using SIMS, is lower than or equal to $1\times10^{18}$ atoms/cm$^3$, preferably lower than or equal to $2\times10^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained using SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained using SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

The composition, structure, method, and the like described in this embodiment can be used in combination as appropriate with the compositions, structures, methods, and the like described in the other embodiments, the example, and the like.

Embodiment 6

In this embodiment, examples of electronic devices each including the secondary battery and the protection circuit thereof described in Embodiment 3 will be described with reference to FIG. 12 and FIG. 13. Note that a secondary battery module includes at least a secondary battery and a protection circuit.

First, examples of small electronic devices each including the secondary battery and the protection circuit thereof of one embodiment of the present invention will be described with reference to FIG. 12A to FIG. 12C.

Figure 12A:
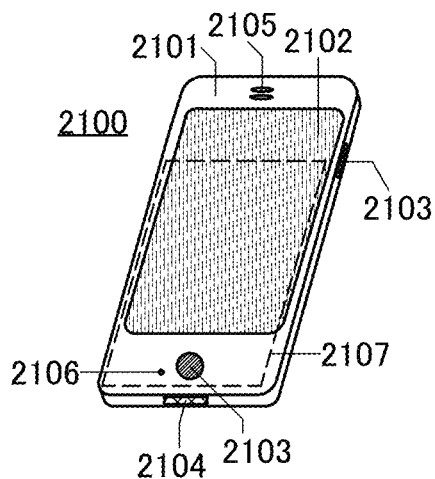
FIG. 12A, FIG. 12B, FIG. 12C, FIG. 12D, and FIG. 12E are diagrams illustrating examples of small electronic devices and vehicles each including a protection circuit of a secondary battery of one embodiment of the present invention.

FIG. 12A illustrates an example of a mobile phone. A mobile phone 2100 includes a housing 2101 in which a display portion 2102 is incorporated, an operation button 2103, an external connection port 2104, a speaker 2105, a microphone 2106, and the like. Note that the mobile phone 2100 includes a secondary battery 2107 and a protection circuit thereof.

The mobile phone 2100 is capable of executing a variety of applications such as mobile phone calls, e-mailing, viewing and editing texts, music reproduction, Internet communication, and computer games.

With the operation button 2103, a variety of functions such as time setting, power on/off operation, wireless communication on/off operation, execution and cancellation of a silent mode, and execution and cancellation of a power saving mode can be performed. For example, the functions of the operation button 2103 can also be set freely by an operating system incorporated in the mobile phone 2100.

In addition, the mobile phone 2100 can execute near field communication conformable to a communication standard. For example, mutual communication with a headset capable of wireless communication enables hands-free calling.

Moreover, the mobile phone 2100 includes the external connection port 2104, and data can be directly transmitted to and received from another information terminal via a connector. In addition, charging can be performed via the external connection port 2104. Note that the charging operation may be performed by wireless power feeding without using the external connection port 2104.

The mobile phone 2100 preferably includes a sensor. As the sensor, for example, a human body sensor such as a fingerprint sensor, a pulse sensor, or a temperature sensor, a touch sensor, a pressure sensitive sensor, an acceleration sensor, or the like is preferably mounted.

Figure 12B:
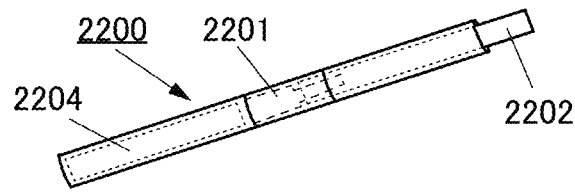

FIG. 12B is a perspective view of a device called a cigarette smoking device (electronic cigarette). In FIG. 12B, an electronic cigarette 2200 includes a heating element 2201, a secondary battery 2204 that supplies electric power to the heating element 2201, and a protection circuit thereof. A stick 2202 is inserted into this, and the stick 2202 is heated by the heating element 2201. To increase safety, a protection circuit for preventing overcharge and overdischarge of the secondary battery is electrically connected to the secondary battery. The secondary battery illustrated in FIG. 12B includes an external terminal for connection to a charger. The secondary battery is a tip portion when the electronic cigarette 2200 is held; thus, it is desirable that the secondary battery 2204 have a short total length and be lightweight. Since the protection circuit of one embodiment of the present invention which is connected to the secondary battery has a high level of safety, the small and lightweight electronic cigarette 2200 that can be used safely for a long time over a long period can be provided.

Figure 12C:
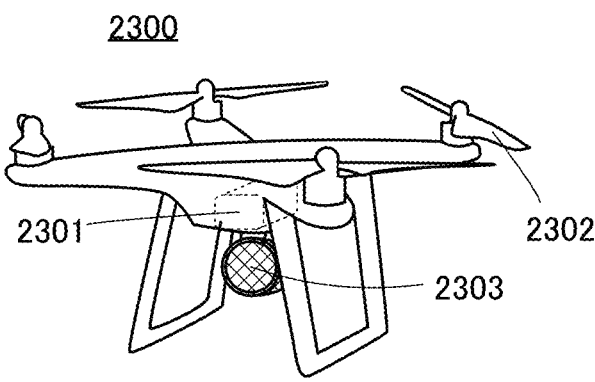

FIG. 12C illustrates an unmanned aircraft 2300 including a plurality of rotors 2302. The unmanned aircraft 2300 includes a secondary battery 2301 and a protection circuit of the secondary battery which are embodiments of the present invention, a camera 2303, and an antenna (not illustrated). The unmanned aircraft 2300 can be remotely controlled through the antenna. The secondary battery and the protection circuit thereof have a high level of safety, and thus can be used safely for a long time over a long period and is suitable as the secondary battery and the protection circuit thereof incorporated in the unmanned aircraft 2300.

Next, examples of vehicles each including the secondary battery and the protection circuit thereof of embodiments of the present invention will be described with reference to FIG. 12D, FIG. 12E, and FIG. 13.

Figure 12D:
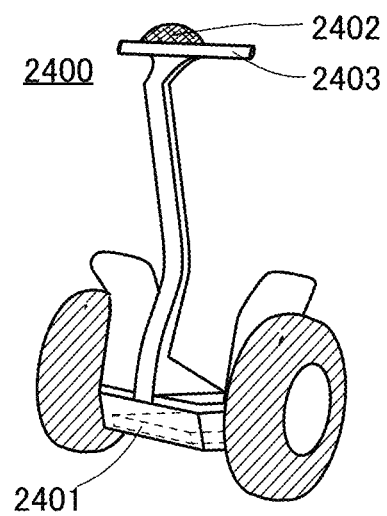

FIG. 12D illustrates an electric two-wheeled vehicle 2400 using the protection circuit of the secondary battery of one embodiment of the present invention. The electric two-wheeled vehicle 2400 includes a secondary battery 2401, a display portion 2402, and a handle 2403. The secondary battery 2401 can supply electricity to a motor serving as a power source. The display portion 2402 can display the remaining battery level of the secondary battery 2401, the velocity and horizontal state of the electric two-wheeled vehicle 2400, and the like.

Figure 12E:
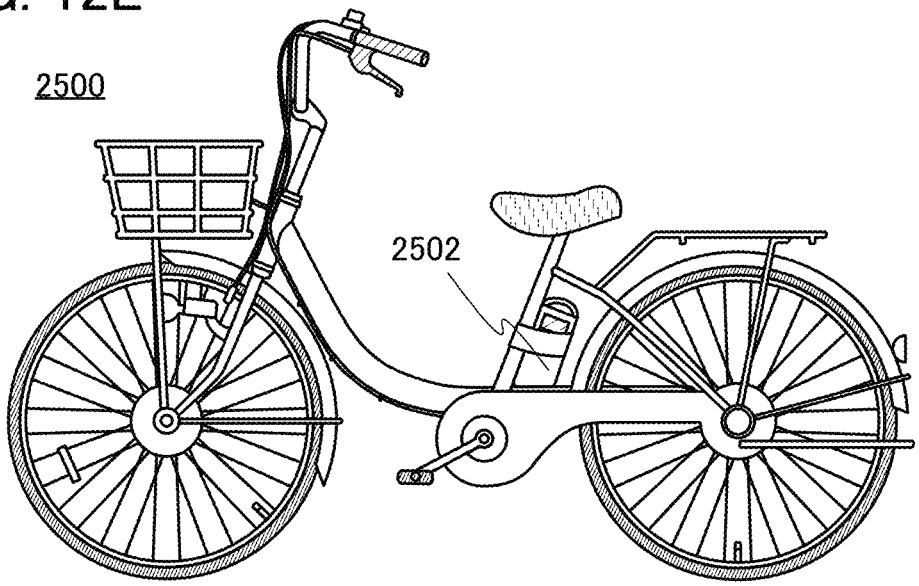

FIG. 12E is an example of an electric bicycle using the secondary battery and the protection circuit thereof of embodiments of the present invention. An electric bicycle 2500 includes a battery pack 2502. The battery pack 2502 includes the protection circuit of the secondary battery of one embodiment of the present invention.

The battery pack 2502 can supply electricity to a motor that assists a rider. Furthermore, the battery pack 2502 can be taken off from the electric bicycle 2500 and carried. The battery pack 2502 and the electric bicycle 2500 may each include a display portion for displaying the remaining battery level and the like.

Figure 13A:
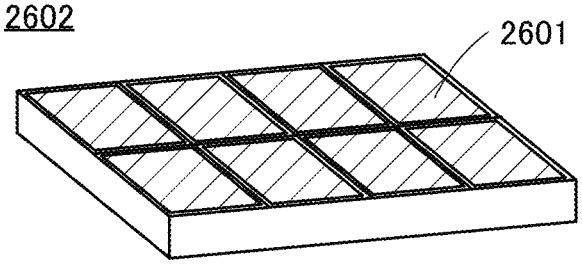
FIG. 13A is a perspective view of a secondary battery module.

Furthermore, as illustrated in FIG. 13A, a secondary battery module 2602 including a plurality of secondary batteries 2601 may be mounted on a hybrid electric vehicle (HV), an electric vehicle (EV), a plug-in hybrid electric vehicle (PHV), or another electronic device.

Figure 13B:
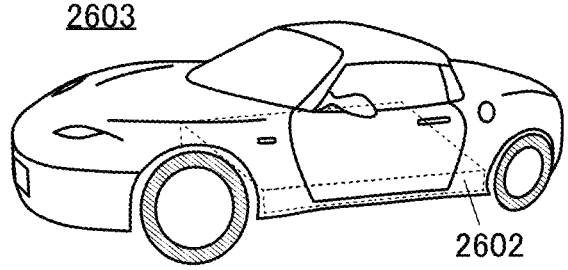
FIG. 13B and FIG. 13C are perspective views showing examples of a vehicle and a house each including a protection circuit of a secondary battery of one embodiment of the present invention.

FIG. 13B illustrates an example of a vehicle including the secondary battery module 2602. A vehicle 2603 is an electric vehicle that runs using an electric motor as a power source. Alternatively, the vehicle 2603 is a hybrid electric vehicle that can run using a power source appropriately selected from an electric motor and an engine. The vehicle 2603 using the electric motor includes a plurality of ECUs (Electronic Control Units) and performs engine control by the ECUs. The ECU includes a microcomputer. The ECU is connected to a CAN (Controller Area Network) provided in the electric vehicle. The CAN is a type of a serial communication standard used as an in-vehicle LAN. The use of the protection circuit of one embodiment of the present invention can achieve a vehicle with a high level of safety and a high mileage.

The secondary battery not only drives the electric motor (not illustrated) but also can supply electric power to a light-emitting device such as a headlight or a room light. Furthermore, the secondary battery can supply electric power to a display device and a semiconductor device included in the vehicle 2603, such as a speedometer, a tachometer, and a navigation system.

In the vehicle 2603, the secondary batteries can be charged by being supplied with electric power from external charging equipment by a plug-in system, a contactless power feeding system, or the like.

Figure 13C:
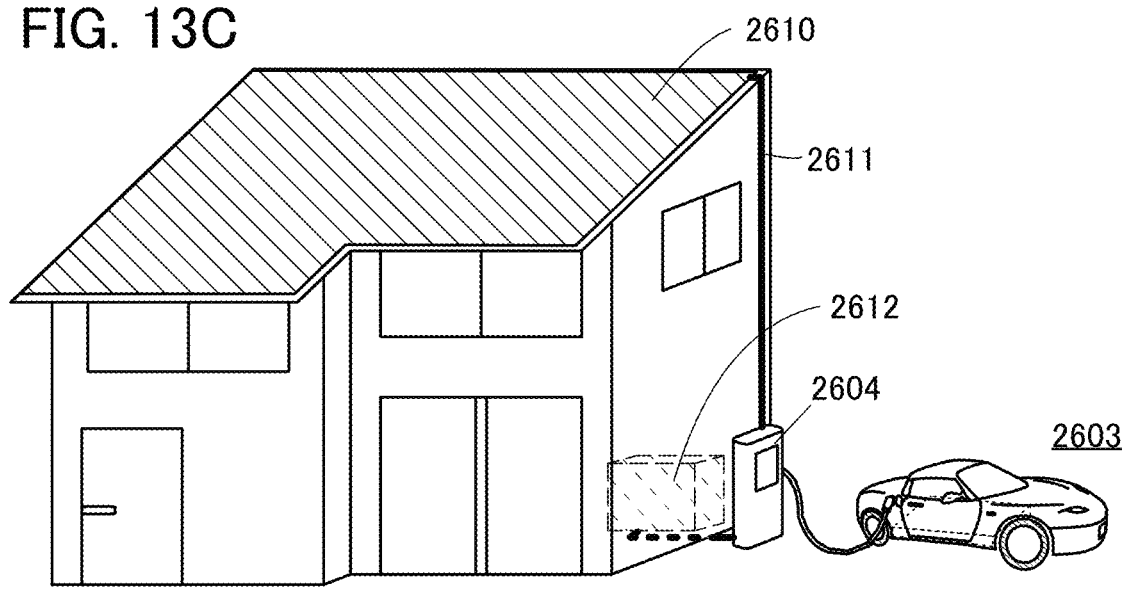

FIG. 13C illustrates a state in which the vehicle 2603 is supplied with electric power from ground-based charging equipment 2604 through a cable. In charging, a given method such as CHAdeMO (registered trademark) or Combined Charging System may be employed as a charging method, the standard of a connector, or the like as appropriate. For example, with a plug-in technique, the secondary battery module 2602 incorporated in the vehicle 2603 can be charged by being supplied with electric power from the outside. The charging can be performed by converting AC electric power into DC electric power through a converter, such as an AC-DC converter. The charging equipment 2604 may be provided for a house as illustrated in FIG. 13C, or may be a charging station provided in a commercial facility.

Although not illustrated, the vehicle may include a power receiving device so that it can be charged by being supplied with electric power from an above-ground power transmitting device in a contactless manner. In the case of the contactless power feeding system, by incorporating a power transmitting device in a road or an exterior wall, charging can be performed not only when the vehicle is stopped but also when driven. In addition, this contactless power feeding system may be utilized to transmit and receive power between vehicles. Furthermore, a solar cell may be provided in the exterior of the vehicle to charge the secondary battery while the vehicle is stopped or driven. To supply electric power in such a contactless manner, an electromagnetic induction method or a magnetic resonance method can be used.

The house illustrated in FIG. 13C includes a power storage system 2612 including the protection circuit of the secondary battery of one embodiment of the present invention and a solar panel 2610. The power storage system 2612 is electrically connected to the solar panel 2610 through a wiring 2611 or the like. The power storage system 2612 may be electrically connected to the ground-based charging equipment 2604. The power storage system 2612 can be charged with electric power generated by the solar panel 2610. The secondary battery module 2602 included in the vehicle 2603 can be charged with the electric power stored in the power storage system 2612 through the charging equipment 2604.

The electric power stored in the power storage system 2612 can also be supplied to other electronic devices in the house. Thus, with the use of the power storage system 2612 of one embodiment of the present invention as an uninterruptible power source, electronic devices can be used even when electric power cannot be supplied from a commercial power source due to power failure or the like.

This embodiment can be implemented in appropriate combination with any of the other embodiments.

REFERENCE NUMERALS

11: battery protection circuit, 12: disconnecting switch, 13: secondary battery, 14: charge control circuit, 15: memory circuit, 16: control circuit, 17: charge overcurrent detection circuit, 18: comparison circuit, 19: overdischarge current detection circuit, 21: first circuit, 22: second circuit, 23: memory controller, 101: first transistor, 102: second transistor, 103: third transistor, 104: fourth transistor, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 364: insulator, 366: conductor, 370: insulator, 372: insulator, 374: insulator, 376: conductor, 380: insulator, 382: insulator, 384: insulator, 386: conductor, 404: insulator, 500: transistor, 500A: transistor, 500B: transistor, 503: conductor, 503a: conductor, 503b: conductor, 510: insulator, 512: insulator, 513: insulator, 514: insulator, 516: insulator, 518: conductor, 520: insulator, 522: insulator, 524: insulator, 530: oxide, 530a: oxide, 530b: oxide, 540a: conductor, 540b: conductor, 542: conductor, 542a: conductor, 542b: conductor, 543a: region, 543b: region, 544: insulator, 545: insulator, 546: conductor, 548: conductor, 550: transistor, 552: insulator, 560: conductor, 560a: conductor, 560b: conductor, 574: insulator, 580: insulator, 581: insulator, 582: insulator, 586: insulator, 600: capacitor, 610: conductor, 612: conductor, 620: conductor, 630: insulator, 640: insulator, 2100: mobile phone, 2101: housing, 2102: display portion, 2103: operation button, 2104: external connection port, 2105: speaker, 2106: microphone, 2107: secondary battery, 2200: electronic cigarette, 2201: heating element, 2202: stick, 2204: secondary battery, 2300: unmanned aircraft, 2301: secondary battery, 2302: rotor, 2303: camera, 2400: electric two-wheeled vehicle, 2401: secondary battery, 2402: display portion, 2403: handle, 2500: electric bicycle, 2502: battery pack, 2601: secondary battery, 2602: secondary battery module, 2603: vehicle, 2604: charging equipment, 2610: solar panel, 2611: wiring, 2612: power storage system

The invention claimed is:

1. A memory circuit comprising:
a first transistor and a second transistor which are electrically connected to a data line;
a memory controller electrically connected to a gate of the first transistor and a gate of the second transistor;
a third transistor whose off state is switched to an on state by a reset signal applied to a gate of the third transistor, wherein a first node is reset in the on state; and
a first capacitor and a second capacitor connected in series,
wherein one of a source and a drain of the second transistor is electrically connected to the data line,
wherein one of a source and a drain of the third transistor is electrically connected to one electrode of the first capacitor, and the other electrode of the first capacitor is electrically connected to one of a source and a drain of the first transistor,
wherein the one electrode of the first capacitor is electrically connected to the one of the source and the drain of the second transistor,
wherein the other electrode of the first capacitor is electrically connected to one electrode of the second capacitor, and a second node is formed between the first capacitor and the second capacitor, and
wherein the first node and the second node are configured to retain different potentials.

2. The memory circuit according to claim 1, wherein the first capacitor has a higher capacitance value than the second capacitor.

3. The memory circuit according to claim 1, wherein each of the first transistor, the second transistor, and the third transistor comprises a metal oxide in a channel formation region, a first insulator over the metal oxide, a second insulator in contact with a bottom surface and a side surface of an opening in the first insulator, and a conductor on a formation surface of the second insulator.

4. A memory circuit comprising:
a first transistor, a second transistor, a third transistor, and a capacitor,
wherein one of a source and a drain of the first transistor is electrically connected to one of a source and a drain of the second transistor,
wherein the other of the source and the drain of the second transistor is electrically connected to one of a source and a drain of the third transistor,
wherein the one of the source and the drain of the third transistor is electrically connected to one electrode of the capacitor, and the other electrode of the capacitor is electrically connected to the other of the source and the drain of the first transistor,
wherein the one electrode of the capacitor is electrically connected to the other of the source and the drain of the second transistor,
wherein a reset line is electrically connected to a gate of the third transistor,
wherein a data line is electrically connected to the one of the source and the drain of the second transistor and electrically connected to the one of the source and the drain of the first transistor,
wherein a connection point between the other electrode of the capacitor and the other of the source and the drain of the first transistor is a node, and
wherein each of the first transistor, the second transistor, and the third transistor comprises a metal oxide in a channel formation region, a first insulator over the metal oxide, a second insulator in contact with a bottom surface and a side surface of an opening in the first insulator, and a conductor on a formation surface of the second insulator.

5. The memory circuit according to claim 4,
wherein a gate of the first transistor is electrically connected to a first line, and
wherein a gate of the second transistor is electrically connected to a second line.

6. The memory circuit according to claim 4, wherein the other of the source and the drain of the first transistor is electrically connected to a fourth transistor of a first circuit.

7. The memory circuit according to claim 4,
wherein the capacitor is a first capacitor, and
wherein the other of the source and the drain of the first transistor is electrically connected to one electrode of a second capacitor.

8. A management system comprising:
a battery protection circuit electrically connected to a secondary battery,
wherein the battery protection circuit comprises the memory circuit according to claim 4.

9. The management system according to claim 8, wherein the battery protection circuit is mounted over an IC chip.

* * * * *